(12) United States Patent
Hines et al.

(10) Patent No.: US 11,195,539 B2
(45) Date of Patent: Dec. 7, 2021

(54) FORCED GAP INSERTION FOR PERVASIVE LISTENING

(71) Applicant: DOLBY LABORATORIES LICENSING CORPORATION, San Francisco, CA (US)

(72) Inventors: Christopher Graham Hines, Sydney (AU); Glenn N. Dickins, Como (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 17/261,884

(22) PCT Filed: Jul. 26, 2019

(86) PCT No.: PCT/US2019/043629
§ 371 (c)(1),
(2) Date: Jan. 21, 2021

(87) PCT Pub. No.: WO2020/023856
PCT Pub. Date: Jan. 30, 2020

(65) Prior Publication Data
US 2021/0304782 A1 Sep. 30, 2021

Related U.S. Application Data

(60) Provisional application No. 62/711,012, filed on Jul. 27, 2018.

(51) Int. Cl.
*G10L 21/0232* (2013.01)
*G10K 11/178* (2006.01)
*G10L 21/0208* (2013.01)

(52) U.S. Cl.
CPC .... *G10L 21/0232* (2013.01); *G10K 11/17885* (2018.01); *G10K 2210/108* (2013.01); *G10L 2021/02087* (2013.01)

(58) Field of Classification Search
CPC ..... G10L 21/0208; G10L 15/20; G10L 15/22; G10L 21/0232; G10L 21/0364;
(Continued)

(56) References Cited

U.S. PATENT DOCUMENTS 6,810,273 B1  10/2004  Mattila
6,868,158 B2   3/2005  Takahashi
(Continued)

FOREIGN PATENT DOCUMENTS

WO   2002084645   10/2002
WO   2015130509    9/2015
WO   2019209973   10/2019

OTHER PUBLICATIONS

Bender, W. et al. "Techniques for Data Hiding" IBM Systems Journal, vol. 35, No. 3 & 4, Jan. 1996, pp. 313-336.
(Continued)

*Primary Examiner* — Mohammad K Islam

(57) ABSTRACT

A pervasive listening method including steps of inserting at least one forced gap in a playback signal (thus generating a modified playback signal), and during playback of the modified playback signal, monitoring non-playback content (e.g., including by generating an estimate of background noise) in a playback environment using output of a microphone in the playback environment. Optionally, the method includes generation of the playback signal, including by processing of (e.g., performing noise compensation on) an input signal using a result (e.g., a background noise estimate) of the monitoring of non-playback content. Other aspects are systems configured to perform any embodiment of the pervasive listening method.

20 Claims, 10 Drawing Sheets

(58) Field of Classification Search
CPC .............. G10L 25/81; G10L 2015/223; G10L 2021/028087; G10K 11/17885; G10K 2210/108
See application file for complete search history.

(56) References Cited

U.S. PATENT DOCUMENTS

| | | |
|---|---|---|
| 7,277,512 B1 | 10/2007 | Barsoum |
| 7,508,947 B2 | 3/2009 | Smithers |
| 7,697,699 B2 | 4/2010 | Ozawa |
| 7,711,557 B2 | 5/2010 | Ozawa |
| 8,437,482 B2 | 5/2013 | Seefeldt |
| 8,547,867 B2 | 10/2013 | Koo |
| 8,949,121 B2 | 2/2015 | Schandl |
| 9,264,834 B2* | 2/2016 | Soulodre .................. H04S 7/301 |
| 9,812,148 B2 | 11/2017 | Bradley |
| 2009/0274310 A1 | 11/2009 | Taenzer |
| 2011/0251704 A1 | 10/2011 | Walsh |
| 2014/0064509 A1 | 3/2014 | Su |
| 2016/0036962 A1* | 2/2016 | Rand ...................... H04W 76/25 455/418 |
| 2016/0098989 A1* | 4/2016 | Layton ................ G10L 21/0208 704/233 |
| 2017/0235543 A1* | 8/2017 | England .............. G10L 19/0017 700/94 |
| 2018/0096678 A1* | 4/2018 | Zhou ........................ G10L 15/32 |
| 2019/0096429 A1* | 3/2019 | Kowali .................. G01S 3/8006 |
| 2020/0045166 A1* | 2/2020 | Furuta ................... H04M 3/002 |

OTHER PUBLICATIONS

Bregman, A.S. "Auditory Scene Analysis" The Perceptual Organization of Sound, MIT Press, 1990.

Swanson, M.D. et al. "Multimedia Data-Embedding and Watermarking Technologies" IEEE Proceedings, vol. 86, Issue 6, Jun. 1998, pp. 1064-1087.

Zwicker, E. et al. "Psychoacoustics: Facts and Models. Germany" 1999.

* cited by examiner

FORCED GAP INSERTION FOR PERVASIVE LISTENING

CROSS-REFERENCE TO RELATED APPLICATION

The application claims the benefit of priority from U.S. Patent Application No. 62/711,012, filed on Jul. 27, 2018, which is hereby incorporated by reference in its entirety.

TECHNICAL FIELD

The invention pertains to systems and methods for performing pervasive listening (e.g., estimating background noise) in an audio signal playback environment, and optionally also generating or processing (e.g., performing noise compensation on) an audio signal for playback using a result (e.g., a noise estimate) of the pervasive listening. In some embodiments, the pervasive listening includes introduction of at least one gap in a playback signal (e.g., in a selected frequency band of the playback signal), thereby generating a modified playback signal, and performing the pervasive listening during playback of the modified playback signal.

BACKGROUND

Herein, a "pervasive listening" method (e.g., implemented by a pervasive listening application running on an appropriately programmed processor) denotes a method including monitoring of sound in a playback environment, other than playback sound emitted from any speaker (in response to an audio playback signal) in the playback environment, and optionally also generating or modifying the audio playback signal (e.g., for the purpose of improving in some respect the playback of the audio content) in response to at least one result of the monitoring. The sound which is monitored is sometimes referred to herein as "non-playback sound." The non-playback sound is captured by at least one microphone in the playback environment. One or more human users may (but need not) be present in the playback environment, and the pervasive listening may be implemented to improve the playback experience of such user(s). The expression "pervasive listener" is sometimes used herein to denote a system or device (e.g., an appropriately programmed processor) configured to perform a pervasive listening method.

Typical pervasive listening methods do not monitor non-playback sound in an effort to detect or characterize short-lived events in the playback environment (e.g., utterance of a short word of speech), where a "short-lived" event in this context denotes an event having a duration less than about 0.5 second. However, in some cases, monitoring of non-playback sound by a pervasive listener may be implemented in a manner intended to detect or characterize a short-lived event in the playback environment having duration less than 0.5 second (e.g., 200 milliseconds or less). Examples of non-playback sound monitored by a pervasive listener include (but are not limited to) background noise, or speech by (or other sound indicative of activity or presence of) at least one human user in the playback environment, over a scale of time longer than a single short utterance of a human user. For example, the non-playback sound may be sound emitted by a vacuum cleaner operated by a human user, or utterance of a long-duration voice command.

Pervasive listening may include accumulation of observations (over time, e.g., with each observation made during the time interval of a different gap in a different frequency band) of non-playback sound to create a statistical inference or estimation of some aspect of the non-playback sound. Some implementations of a pervasive listener may use forced gaps (inserted in the playback signal in accordance with an embodiment of the present invention) to monitor non-playback sound which occurs "in" a forced gap in the sense that it occurs during the time interval of the gap in the frequency band(s) in which the gap is present. For example, some implementations of a pervasive listener may use forced gaps (inserted in the playback signal in accordance with an embodiment of the present invention) to infer the occurrence of a short-lived occurrence or event of non-playback sound from a sudden, contemporaneous (i.e., within a single, short time interval) onset of energy in each of three (or other small number of) forced gaps (each in a different frequency band), where the energy detected in each of the gaps is an unexpected and substantially improbable (in view of statistics which the pervasive listener has determined as a result of an accumulation of observations in each of a number of different frequency bands) amount of energy.

In an example of a pervasive listener which uses forced gaps (inserted in accordance with an embodiment of the present invention), 40 different frequency bands are available for insertion of gaps, and at least one forced gap is inserted in every 4 consecutive bands to allow the pervasive listener to estimate the full spectrum of non-playback sound by detecting non-playback sound in each of the gaps. In a typical implementation, this may require insertion of a sequence of 10 to 20 forced gaps, each of the forced gaps having duration of about 20-100 ms. Thus, it may require at least about 200 milliseconds (200 ms) to 2 seconds to obtain the estimate (by monitoring non-playback sound in the noted sequence of forced gaps). In some contemplated embodiments, the pervasive listener would require a time in a range from about 0.5 second to 1 second to determine an estimate (in a full frequency range) of non-playback sound by monitoring the non-playback sound in a sequence of forced gaps.

For another example, if non-playback sound in a narrow frequency band is to be detected by a pervasive listener, as much as about 4 seconds may be required for the pervasive listener to detect it (e.g., in the case that a gap had been forced in that band just before the onset of the non-playback sound). In a typical implementation (with 40 bands available for insertion of forced gaps, each of the gaps having duration of about 100 ms), as much as about 2 seconds (on average) may be required to detect non-playback sound in any of the bands.

In cases in which a playback signal is quiet in at least one band (even without insertion of any forced gap in such band in accordance with an embodiment of the invention), it may be possible for a pervasive listener to detect very short-lived occurrences or events of non-playback sound (e.g., events having duration much shorter than any of the examples noted herein) even without forced gap insertion.

With the rapidly increasing number of always-listening smart speaker devices entering the home and workplace, the need for devices to know more about their environment so that they can provide better experiences and be more helpful to users is increasing. Noise compensation (an example of a pervasive listening method) is one such functionality. It ensures music and voice assistant speech is always heard by the listener, regardless of the environmental noise conditions. Smart voice assistants must also be listening for new user requests in a variety of adverse acoustic environments.

The task of estimating environmental conditions and activity in a playback environment is significantly more difficult while devices are playing back music and other audio content, as the devices hear themselves (the 'echo' problem) as well as the background activity. Acoustic echo cancellation, the standard proposed solution to this problem, is process that models the way echo is received at the device microphones such that it can be removed, leaving a residual signal representative of the background scene. As echo cancellation is a computationally expensive task, one that grows in complexity with the number of playback channels and microphones present in a device, it is not unreasonable to expect lower cost devices and devices with multichannel speaker configurations to demand microphone capabilities with only weak or non-existent echo cancellation available. Cheaper and lower cost devices are also more likely to be worn and to be close to users as they are more portable and can be placed in a larger variety of locations in a home or workplace.

The ubiquity of portable electronics means that people are engaging with audio on a day to day basis in many different environments. For example, listening to music, watching entertainment content, listening for audible notifications and directions, and participating in a voice call. The listening environments in which these activities take place can often be inherently noisy, with constantly changing background noise conditions, which compromises the enjoyment and intelligibility the listening experience. Placing the user in the loop of manually adjusting the playback level in response to changing noise conditions distracts the user from the listening task, and heightens the cognitive load required to engage in audio listening tasks.

Noise compensated media playback (NCMP) alleviates this problem by adjusting the volume of any media being played to be suitable for the noise conditions in which the media is being played back in. The concept of NCMP is well known, and many publications claim to have solved the problem of how to implement it effectively.

While a related field called Active Noise Cancellation attempts to physically cancel interfering noise through the re-production of acoustic waves, NCMP adjusts the level of playback audio so that the adjusted audio is audible and clear in the playback environment in the presence of background noise.

The primary challenge in any real implementation of NCMP is the automatic determination of the present background noise levels experienced by the listener, particularly in situations where the media content is being played over speakers where background noise and media content are highly acoustically coupled. Solutions involving a microphone are faced with the issue of the media content and noise conditions being observed (detected by the microphone) together.

A typical audio playback system implementing NCMP is shown in FIG. 1. The system includes content source 1 which outputs, and provides to noise compensation subsystem 2, an audio signal indicative of audio content (sometimes referred to herein as media content or playback content). The audio signal is intended to undergo playback to generate sound (in an environment) indicative of the audio content. The audio signal may be a speaker feed (and noise compensation subsystem 2 may be coupled and configured to apply noise compensation thereto by adjusting the playback gains of the speaker feed) or another element of the system may generate a speaker feed in response to the audio signal (e.g., noise compensation subsystem 2 may be coupled and configured to generate a speaker feed in response to the audio signal and to apply noise compensation to the speaker feed by adjusting the playback gains of the speaker feed).

The FIG. 1 system also includes noise estimation system 5, at least one speaker 3 (which is coupled and configured to emit sound indicative of the media content) in response to the audio signal (or a noise compensated version of the audio signal generated in subsystem 2), and microphone 4, coupled as shown. In operation, microphone 4 and speaker 3 are in a playback environment (e.g., a room) and microphone 4 generates a microphone output signal indicative of both background (ambient) noise in the environment and an echo of the media content. Noise estimation subsystem 5 (sometimes referred to herein as a noise estimator) is coupled to microphone 4 and configured to generate an estimate (the "noise estimate" of FIG. 1) of the current background noise level(s) in the environment using the microphone output signal. Noise compensation subsystem 2 (sometimes referred to herein as a noise compensator) is coupled and configured to apply noise compensation by adjusting (e.g., adjusting playback gains of) the audio signal (or adjusting a speaker feed generated in response to the audio signal) in response to the noise estimate produced by subsystem 5, thereby generating a noise compensated audio signal indicative of compensated media content (as indicated in FIG. 1). Typically, subsystem 2 adjusts the playback gains of the audio signal so that the sound emitted in response to the adjusted audio signal is audible and clear in the playback environment in the presence of background noise (as estimated by noise estimation subsystem 5).

As will be described below, a background noise estimator (e.g., noise estimator 5 of FIG. 1) for use in an audio playback system which implements noise compensation, can be used (with forced gap insertion) in accordance with a class of embodiments of the present invention.

Numerous publications have engaged with the issue of noise compensated media playback (NCMP), and an audio system that compensates for background noise can work to many degrees of success.

It has been proposed to perform NCMP without a microphone, and instead to use other sensors (e.g., a speedometer in the case of an automobile). However, such methods are not as effective as microphone based solutions which actually measure the level of interfering noise experienced by the listener. It has also been proposed to perform NCMP with reliance on a microphone located in an acoustic space which is decoupled from sound indicative of the playback content, but such methods are prohibitively restrictive for many applications.

The NCMP methods mentioned in the previous paragraph do not attempt to measure noise level accurately using a microphone which also captures the playback content, due to the "echo problem" arising when the playback signal captured by the microphone is mixed with the noise signal of interest to the noise estimator. Instead these methods either try to ignore the problem by constraining the compensation they apply such that an unstable feedback loop does not form, or by measuring something else that is somewhat predictive of the noise levels experienced by the listener.

It has also been proposed to address the problem of estimating background noise from a microphone output signal (indicative of both background noise and playback content) by attempting to correlate the playback content with the microphone output signal and subtracting off an estimate of the playback content captured by the microphone (referred to as the "echo") from the microphone output. The content of a microphone output signal generated as the microphone captures sound, indicative of playback content X emitted from speaker(s) and background noise N, can be denoted as WX+N, where W is a transfer function determined by the speaker(s) which emit the sound indicative of playback content, the microphone, and the environment (e.g., room) in which the sound propagates from the speaker(s) to the microphone. For example, in an academically proposed method (to be described with reference to FIG. 2) for estimating the noise N, a linear filter W' is adapted to facilitate an estimate, W'X, of the echo (playback content captured by the microphone), WX, for subtraction from the microphone output signal. Even if nonlinearities are present in the system, a nonlinear implementation of filter W' is rarely implemented due to computational cost.

FIG. 2 is a diagram of a system for implementing the above-mentioned conventional method (sometimes referred to as echo cancellation) for estimating background noise in an environment in which speaker(s) emit sound indicative of playback content. A playback signal X is presented to a speaker system S (e.g., a single speaker) in environment E. Microphone M is located in the same environment E, and background noise N and typically also at least one human user (listener) L is present in the environment E. In response to playback signal X, speaker system S emits sound which arrives (with any environmental noise N present in environment E) at microphone M. The microphone output signal is Y=WX+N, where W denotes a transfer function which is the combined response of the speaker system S, playback environment E, and microphone M. The general method implemented by the FIG. 2 system is to adaptively infer the transfer function W from Y and X, using any of various adaptive filter methods. As indicated in FIG. 2, linear filter W' is adaptively determined to be an approximation of transfer function W.' The playback signal content (the "echo") indicated by microphone signal M is estimated as W'X, and W'X is subtracted from Y to yield an estimate, Y'=WX−W'X+N, of the noise N. Adjusting the level of X in proportion to Y' produces a feedback loop if a positive bias exists in the estimation. An increase in Y' in turn increases the level of X, which introduces an upward bias in the estimate (Y') of N, which in turn increases the level of X and so on. A solution in this form would rely heavily on the ability of the adaptive filter W' to cause subtraction of W'X from Y to remove a significant amount of the echo WX from the microphone signal M.

Further filtering of the signal Y' is usually required in order to keep the FIG. 2 system stable. As most noise compensation embodiments in the field exhibit lacklustre performance, it is likely that most solutions typically bias noise estimates downward and introduce aggressive time smoothing in order to keep the system stable. This comes at the cost of reduced and very slow acting compensation.

Noise compensation (e.g., automatically levelling of speaker playback content) to compensate for environmental noise conditions is a well-known and desired feature, but has not yet been convincingly implemented. Using a microphone to measure environmental noise conditions also measures the speaker playback content, presenting a major challenge for noise estimation (e.g., online noise estimation) needed to implement noise compensation. Some embodiments of the present invention are noise estimation methods and systems which generate, in an improved manner (including insertion of forced gaps into a playback signal), a noise estimate useful for performing noise compensation (e.g., to implement many embodiments of noise compensated media playback).

Since echo cancellation is a computationally expensive task, one that grows in complexity with the number of playback channels and microphones present in a device, it is not unreasonable to expect lower cost devices and devices with multichannel speaker configurations to demand noise compensation capabilities with only weak or non-existent echo cancellation available. Cheaper and lower cost devices are also more likely to be worn, and to be close to users as they are more portable and can be placed in a larger variety of locations in a home or workplace. Devices in this category are the best candidates for the use of noise compensation as they can optimize for what the user hears through the convenience of proximity.

A sampling gap or "gap" (defined below) in a frequency band, at a time (or in a time interval) of an audio signal, is a time and frequency slice that, after playback and capture of audio content of the audio signal in the time and frequency slice, may be indicative of the background noise in the playback environment. When a device (in a playback environment) is silent, not playing any audio content, all time and frequency slices of sound captured in the playback environment may be indicative of the background noise in the playback environment. When audio content (e.g., music content) is played back by the device, the output of each microphone in the environment is corrupted by the noise.

Above-referenced U.S. Provisional Patent Application No. 62/663,302 describes a method and system for detecting and making use of sampling gaps in the context of noise estimation, either with or without performance of echo cancellation. When such a system performs noise estimation with performance of echo cancellation, the residual cancellation signal (e.g., the signal Y' of FIG. 2 or M'res of FIG. 12, discussed below) typically has many gaps, and generally speaking the performance of the system is content independent. When such a system performs noise estimation without echo cancellation, the quality of the noise estimation (and thus of user experience during playback of content which undergoes noise compensation using the estimated noise) becomes content-dependent, since the type and frequency of gaps in the content affect the quality of the noise estimation. In both cases (with and without echo cancellation), the method and system described in U.S. Application No. 62/663,302 is able to take advantage of available gaps (in the playback content, or in the playback content and residual cancellation signal) to estimate background noise levels. The inventors have recognized that the novel step of "forcing" gaps to appear in playback content in connection with noise estimation (e.g., of the types described in U.S. Application No. 62/663,302) or another pervasive listening method, can improve the performance of the noise estimation (especially when the noise estimation is performed without echo cancellation or with weak echo cancellation) or other pervasive listening method.

BRIEF DESCRIPTION OF THE INVENTION

In a class of embodiments, the invention is a pervasive listening method, including steps of:

inserting at least one gap into at least one selected frequency band of an audio playback signal (e.g., each said gap is inserted into a selected frequency band, in a selected time interval, of the audio playback signal) to generate a modified playback signal;

during emission of sound in a playback environment in response to the modified playback signal, using a microphone in the playback environment to generate a microphone output signal, wherein the sound is indicative of playback content of the modified playback signal, and the microphone output signal is indicative of non-playback sound in the playback environment and the playback content; and monitoring (typically, including by generating an estimate of at least one aspect of) the non-playback sound in the playback environment in response to the modified playback signal and the microphone output signal.

Preferably, each gap is inserted (in a selected frequency band in a selected time interval of the playback signal) in an effort (i.e., a manner intended) so that any artifact (in the sound emitted in the playback environment in response to the modified playback signal) resulting from insertion of the gap has low perceptibility to a user in the playback environment, and high identifiability by a pervasive listener which performs the monitoring. Preferably, each gap is inserted (in a selected frequency band in a selected time interval) such that the sound emitted in the playback environment in response to the modified playback signal is perceivable by the user without any significant artifact resulting from insertion of the gap, in the sense that any perceived artifact resulting from gap insertion is reasonable (not unduly objectionable) for the application. For example, in typical embodiments, any artifact resulting from the gap insertion is no more perceivable to a human user than any artifact introduced into audio by MP3 encoding of the audio.

In typical embodiments, the pervasive listening method is a noise estimation method, the microphone output signal is indicative of background noise in the playback environment, and the monitoring includes generating an estimate of background noise in the playback environment in response to the modified playback signal and the microphone output signal.

Typically, the monitoring includes generation of an estimate of at least one aspect of the non-playback sound in the playback environment in response to the modified playback signal and the microphone output signal, and the method also includes a step of generating the audio playback signal (e.g., in a pervasive listening subsystem which also performs the monitoring of the non-playback sound) in response to the estimate of at least one aspect of the non-playback sound in the playback environment (e.g., in an effort to improve playback of content of the audio playback signal).

In some embodiments, each gap is inserted into the playback signal based on (e.g., in response to urgency values indicative of) urgency or need for a gap (e.g., in at least one specific frequency band of the playback signal). In some embodiments, each gap is inserted into the playback signal based on (e.g., in response to urgency values indicative of) the need for (i.e., urgency for insertion of) a gap (e.g., in each band of a set of frequency bands of the playback signal), and based on expected perceptual effect (e.g., in response to perceptual freedom values indicative of expected perceptual effect) of insertion of a gap in (e.g., in at least one specific frequency band, at a specific time interval, of) the playback signal (e.g., in a manner including balancing of urgency for a gap and expected perceptual effect of insertion of the gap).

In some embodiments, the method includes steps of:

determining a probability distribution indicative of a probability for each band of a set of frequency bands of the playback signal; and in accordance with the probability distribution, randomly selecting at least one of the frequency bands of the set, and inserting a gap in each of said at least one of the frequency bands. In some such embodiments, the probability distribution is based on need for (i.e., urgency for insertion of) a gap in each said band of the set of frequency bands of the playback signal. In some such embodiments, the probability distribution is based on expected perceptual effect of insertion of a gap in each said band of the set of frequency bands of the playback signal. In some such embodiments, the probability distribution is based both on need for a gap, and expected perceptual effect of insertion of the gap, in each said band of the set of frequency bands of the playback signal.

In typical embodiments, the pervasive listening (e.g., noise estimation or noise compensation) method includes a step of generating urgency values (i.e., signal(s) or data indicative of urgency values) in response to the microphone output signal and the modified playback signal. In some such embodiments, the urgency values are indicative of need for (i.e., urgency for insertion of) a gap in each band of a set of frequency bands of the playback signal, and the need for a gap in said each band is based on elapsed time since occurrence of a previous gap in the band. Typically, insertion of each gap into the playback signal is at least partially based on (e.g., performed in response to) the urgency values.

In some (but not all) embodiments, the monitoring of the non-playback sound includes performance of echo cancellation in response to the microphone output signal and the modified playback signal.

In some embodiments, the monitoring of the non-playback sound includes generation of background noise estimates, the method also includes a step of generating the audio playback signal (e.g., in a pervasive listening subsystem which also performs the monitoring of the non-playback sound) in response to the background estimates (e.g., in an effort to improve playback of content of the audio playback signal), and the step of generating the audio playback signal includes performance of noise compensation on an input audio signal in response to the background estimates.

Aspects of the invention include a system configured (e.g., programmed) to perform any embodiment of the inventive method or steps thereof, and a tangible, non-transitory, computer readable medium which implements non-transitory storage of data (for example, a disc or other tangible storage medium) which stores code for performing (e.g., code executable to perform) any embodiment of the inventive method or steps thereof. For example, embodiments of the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and a processing subsystem that is programmed (and/or otherwise configured) to perform an embodiment of the inventive method (or steps thereof) in response to data asserted thereto.

NOTATION AND NOMENCLATURE

Figure 1:
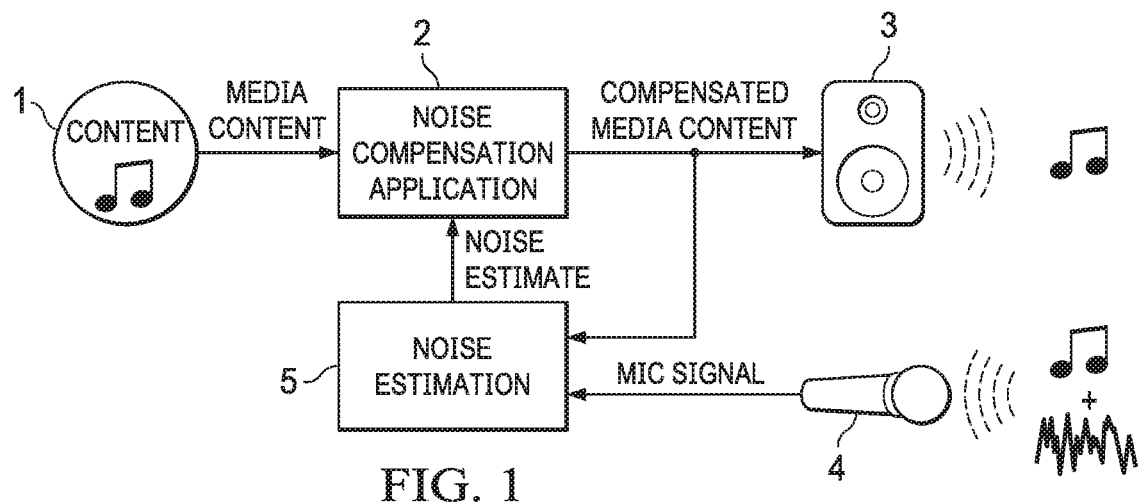
FIG. 1 is a block diagram of an audio playback system implementing noise compensated media playback (NCMP).

Throughout this disclosure, including in the claims, a "gap" in an audio signal (and in playback content of the audio signal) denotes a time (or time interval) of the signal at (or in) which playback content (e.g., in at least one frequency band) is missing (or has a level less than a predetermined value). The audio signal may have a banded frequency-domain representation (in each of a sequence of times, or time intervals, of the signal) comprising frequency-domain playback content in each band of a set of different frequency bands (at each time or time interval), and may have a gap in at least one of the frequency bands (at a time or time interval of the audio signal).

Throughout this disclosure, including in the claims, "speaker" and "loudspeaker" are used synonymously to denote any sound-emitting transducer (or set of transducers) driven by a single speaker feed. A typical set of headphones includes two speakers. A speaker may be implemented to include multiple transducers (e.g., a woofer and a tweeter), all driven by a single, common speaker feed (the speaker feed may undergo different processing in different circuitry branches coupled to the different transducers).

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

DETAILED DESCRIPTION OF EMBODIMENTS

Many embodiments of the present invention are technologically possible. It will be apparent to those of ordinary skill in the art from the present disclosure how to implement them. Some embodiments of the inventive system and method are described herein with reference to FIGS. 3-14.

In accordance with typical embodiments of the present invention gaps (referred to as "forced" gaps) are inserted into an audio playback signal, to introduce an intentional distortion of the audio playback content in order to provide glimpses at background noise (or other non-playback sound in the playback environment) to be monitored. Typically, forced gaps are inserted artificially in particular frequency bands in which a corresponding estimate of noise (or other non-playback sound) has gone stale (e.g., so that the forced gaps can be automatically used in accordance with the gap confidence framework described in U.S. Provisional Patent Application No. 62/663,302). In some embodiments, the distortions are carefully masked perceptually, to provide a good quality listening experience despite introduction of the forced gaps, and to implement responsive noise estimation (or another pervasive listening method) in a content-independent way even without use of an echo canceller.

Figure 3:
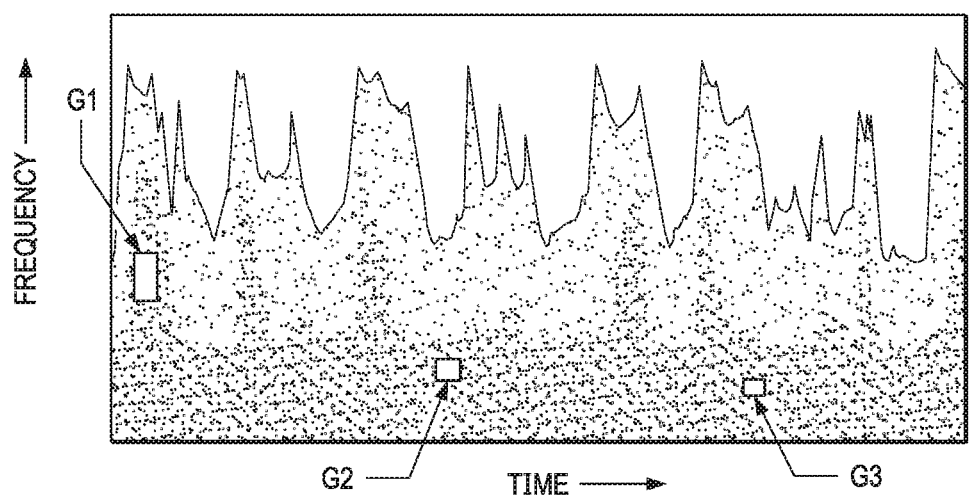
FIG. 3 is a spectrogram of a modified audio signal, into which forced gaps have been inserted by performing an embodiment of the inventive method.

In some embodiments, a sequence of forced gaps is inserted in a playback signal, each forced gap in a different frequency band (or set of bands) of the playback signal, to allow a pervasive listener to monitor non-playback sound which occurs "in" each forced gap in the sense that it occurs during the time interval in which the gap occurs and in the frequency band(s) in which the gap is inserted. FIG. 3 is an example of a spectrogram of modified audio playback signal, into which such forced gaps have been inserted by performing an embodiment of the invention. More specifically, to generate the spectrogram of FIG. 3, an embodiment of the inventive method was performed on an audio playback signal to introduce forced gaps (e.g., gaps G1, G2, and G3 shown in FIG. 3) in frequency bands thereof, thereby generating the modified audio playback signal. In the spectrogram shown in FIG. 3, position along the horizontal axis indicates time and position along the vertical axis indicates frequency of the content of the modified audio playback signal at an instant of time. The density of dots in each small region (each such region centered at a point having a vertical and horizontal coordinate) indicates energy of the content of the modified audio playback signal at the corresponding frequency and instant of time (denser regions indicate content having greater energy, and less dense regions indicate content having lower energy). Thus, the gap G1 occurs at a time (i.e., in a time interval) earlier than the time at which (i.e., the time interval in which) gap G2 or G3 occurs, and gap G1 has been inserted in a higher frequency band than the frequency band in which gap G2 or G3 has been inserted.

Introduction of a forced gap into a playback signal in accordance with typical embodiments of the invention is distinct from simplex device operation in which a device pauses a playback stream of content (e.g., in order to better hear the user and the user's environment). Introduction of forced gaps into a playback signal in accordance with typical embodiments of the invention is optimized to significantly reduce (or eliminate) perceptibility of artifacts resulting from the introduced gaps during playback, preferably so that the forced gaps have no or minimal perceptible impact for the user, but so that the output signal of a microphone in the playback environment is indicative of the forced gaps (e.g., so the gaps can be exploited to implement a pervasive listening method). By using forced gaps which have been introduced in accordance with typical embodiments of the invention, a pervasive listening system may monitor non-playback sound (e.g., sound indicative of background activity and/or noise in the playback environment) even without the use of an acoustic echo canceller.

Figure 4:
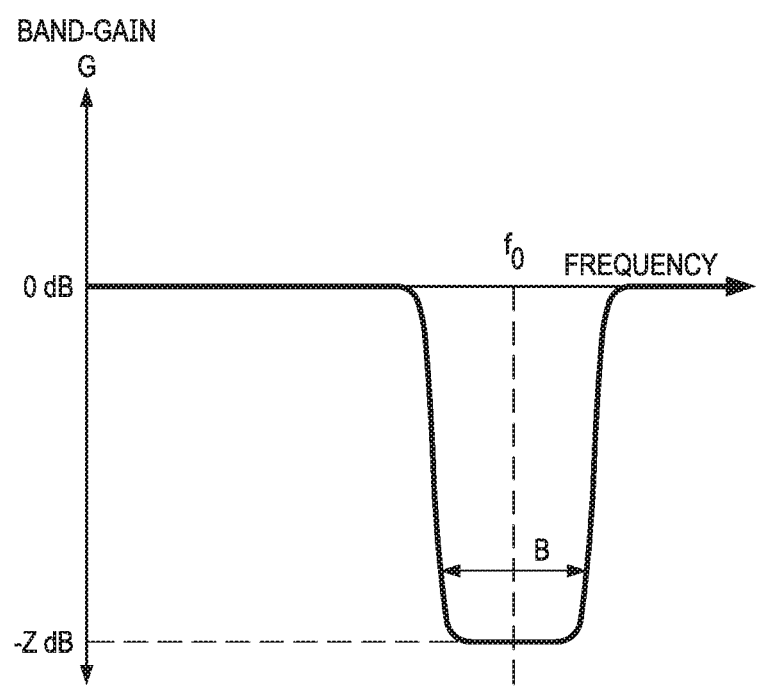
FIG. 4 is a graph of band gain, as a function of frequency, applied to a frequency band of an audio signal to force a gap in audio content of the signal in the band in accordance with some embodiments of the invention. The gain (and the gap) has center frequency $f_0$ and bandwidth B. The depth of the gap may be set (e.g., by interpolation) to a desired value between 0 dB and −Z dB in accordance with an embodiment of the invention.
Figure 5:
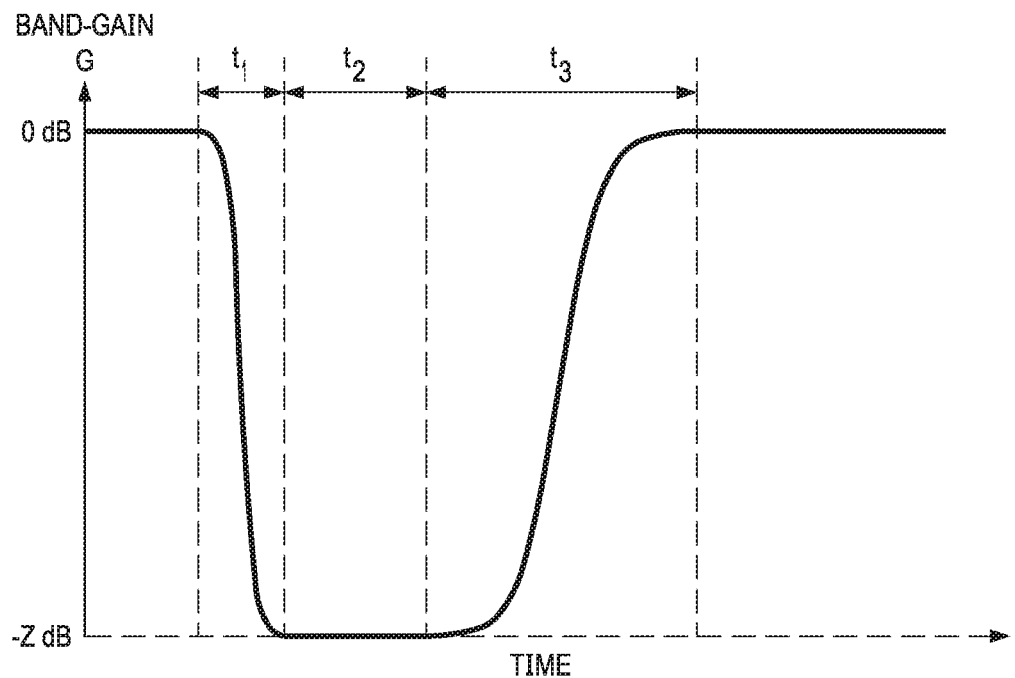
FIG. 5 is a profile of band gain, as a function of time, applied to a frequency band of an audio signal to force a gap (the same gap indicated in FIG. 4) in audio content of the signal in the band. Three time intervals, t1, t2, and t3, of the gap are indicated.

With reference to FIGS. 4 and 5, we next describe an example of a parameterized forced gap which may be inserted in a frequency band of an audio playback signal, and criteria for selection of the parameters of such a forced gap. The parameterized forced gap is an attenuation of playback content using a band attenuation, G, whose profiles over both time and frequency resemble the profiles shown in FIGS. 4 and 5. The gap is forced by applying attenuation G to a playback signal over a range ("band") of frequencies defined by a center frequency $f_0$ (indicated in FIG. 4) and bandwidth B (also indicated in FIG. 4), with the attenuation varying as a function of time at each frequency in (i.e., in each frequency bin within) the band with a profile resembling that shown in FIG. 5. The maximum value of the attenuation G (as a function of frequency across the band) may be controlled to increase from 0 dB (at the lowest frequency of the band) to a maximum attenuation (suppression depth) Z at the center frequency $f_0$ (as indicated in FIG. 4), and to decrease (with increasing frequency above the center frequency) to 0 dB (at the highest frequency of the band).

FIG. 4 is a graph indicative of a profile of the band attenuation G, as a function of frequency (i.e., frequency bin), applied to frequency components of an audio signal to force a gap in audio content of the signal in the band. The audio signal may be a playback signal (e.g., a channel of a multi-channel playback signal), and the audio content may be playback content.

FIG. 5 is a profile of the band attenuation G, as a function of time, applied to the frequency component at center frequency $f_0$, to force the gap indicated in FIG. 4 in audio content of the signal in the band. For each other frequency component in the band, the band gain as a function of time has a similar profile to that shown in FIG. 5, but the suppression depth Z of FIG. 5 is replaced by an interpolated suppression depth kZ, where k is a factor which ranges from 0 to 1 (as a function of frequency), so that kZ has the FIG. 4 profile. For each frequency component, the attenuation G is also interpolated (as a function of time) from 0 dB to the suppression depth kZ (e.g., with k=1, as indicated in FIG. 5, at the center frequency), e.g., to reduce musical artifacts resulting from introduction of the gap. Three regions (time intervals), t1, t2, and t3, of this latter interpolation are shown in FIG. 5.

Thus, when a gap forcing operation occurs for a particular frequency band (i.e., the band centered at center frequency, $f_0$, shown in FIG. 4), the attenuation G applied to each frequency component in the band (i.e., to each bin within the band) follows a trajectory as shown in FIG. 5. Starting at 0 dB, it drops to a depth −kZ dB in t1 seconds, remains there for t2 seconds, and finally rises back to 0 dB in t3 seconds. The total time t1+t2+t3 should be selected with consideration of the time-resolution of whatever frequency transform is being used to analyze the microphone feed, as well as a reasonable duration of time that is not too intrusive for the user.

Typical embodiments of the invention insert forced gaps in accordance with a predetermined, fixed banding structure that covers the full frequency spectrum of the audio playback signal, and includes $B_{count}$ bands (where $B_{count}$ is a number, e.g., $B_{count}$=49). To force a gap in any of the bands, a band attenuation is applied in the band. Specifically, for the jth band, an attenuation, Gj, is applied over the frequency region defined by the band. In determining the number of bands and the width of each band, a tradeoff exists between perceptual impact (narrower bands with gaps are better in that they typically have less perceptual impact) and usefulness of the gaps (wider bands with gaps are better for implementing noise estimation (and other pervasive listening methods) and reducing the time ("convergence" time) required to converge to a new noise estimate (or other value monitored by pervasive listening), in all frequency bands of a full frequency spectrum, e.g., in response to a change in background noise or playback environment status). If only a limited number of gaps can be forced at once, it will take a longer time to force gaps sequentially in a large number of small bands (than to force gaps sequentially in a smaller number of larger bands), resulting in longer convergence time. Larger bands (with gaps) provide a lot of information about the background noise (or other value monitored by pervasive listening) at once, but have a larger perceptual impact.

Figure 6:
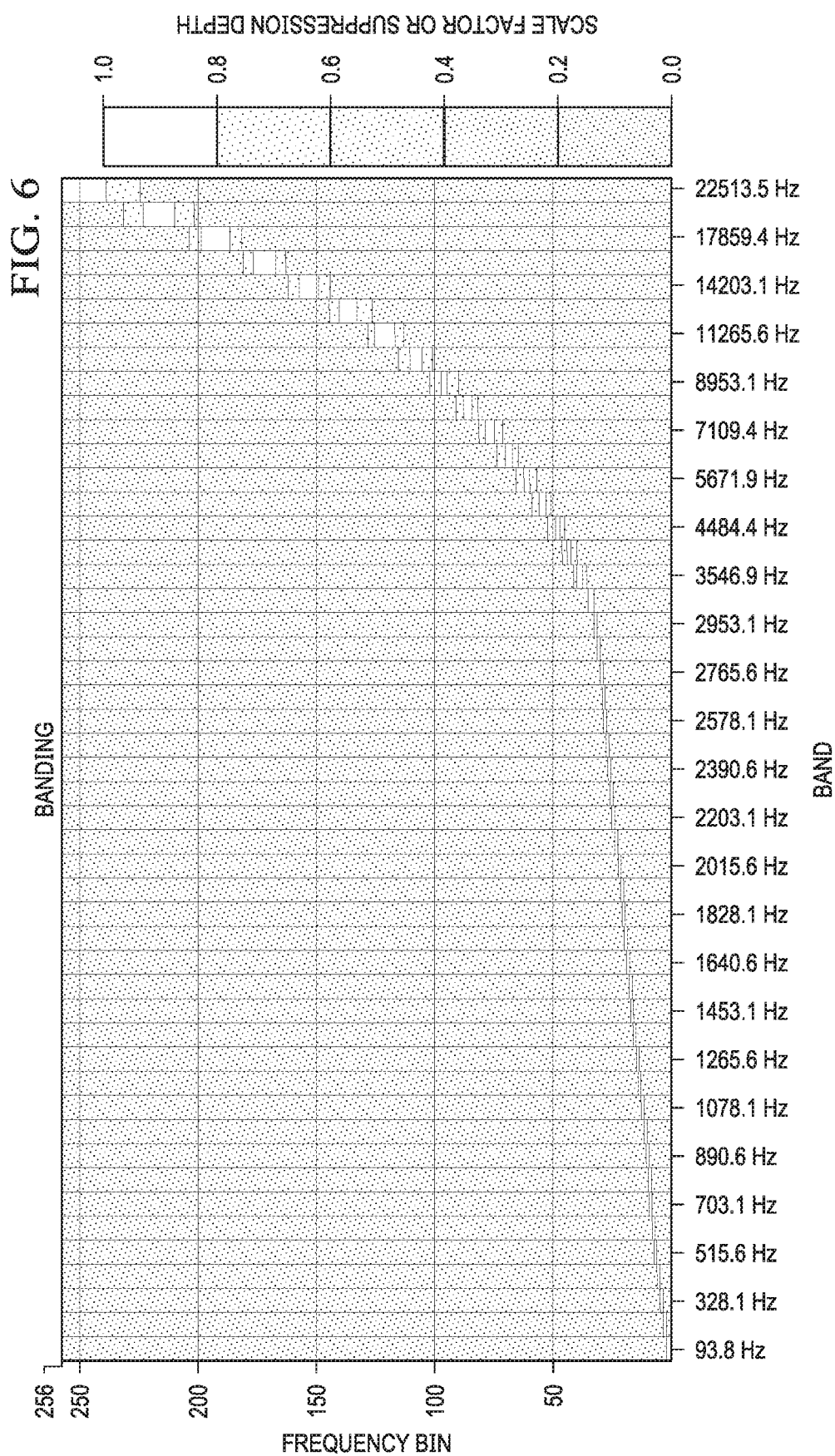
FIG. 6 is a graph illustrating an example of a banding structure (including 49 frequency bands) of an audio signal into which gaps are inserted in accordance with some embodiments of the invention.

FIG. 6 illustrates an example of a banding structure for a playback signal, with a $B_{count}$ equal to 49, and with the center frequency of each of 25 of the 49 bands indicated along the horizontal axis, which has been determined to be a sensible middle ground for the above-described tradeoff. Each band of the FIG. 6 structure has a predetermined gap associated therewith, with the maximum suppression depth of the gap (in each bin within the band) indicated (in a manner explained below) by degree of darkness in the graph at the right side of FIG. 6. The width of the bands of FIG. 6 is selected to be logarithmically increasing with increasing frequency (as with critical bands), and the width of the forced gap in each band (and the bin number which is the center of the forced gap in each band) is also selected to be logarithmically increasing with increasing frequency. This facilitates interoperability with other components that operate in this domain to perform perceptual audio processing. Logarithmically distributed banding structures, following a critical banding structure, make efficient use of a smaller number of bands. Within each band of FIG. 6 (e.g., the band having center frequency 7109.4 Hz), there are 256 frequency bins (indicated along the vertical axis on the left side of FIG. 6). For each bin, there is an associated suppression depth kZ, which is the maximum suppression applied (as described above with reference to FIGS. 4 and 5) to the playback content in such bin, where Z corresponds to the value Z in FIG. 5, and k is a scale factor which ranges from 0 to 1 (as a function of frequency of the bin within the relevant band). For each bin within each band, the scale factor k is indicated by degree of darkness in the graph at the right side of FIG. 6. Thus, the maximum scale factor, k=1, for the band having center frequency 7109.4 Hz, occurs in a bin having relatively low frequency (in about the 70$^{th}$ bin), and the maximum scale factor, k=1, for the band having center frequency 17859.4 Hz, occurs in a bin having relatively higher frequency (in about the 180$^{th}$ bin).

When assessing perceptual impact of introducing forced gaps (of the type discussed with reference to FIGS. 4 and 5) in frequency bands of playback content, it is useful to refer to values of the above-discussed three timing parameters t1, t2, t3, and the depth Z, for each band, and the number of bands, $B_{count}$. In typical embodiments of the invention, these parameters have default values, and minimum and maximum values, as indicated below in Table 1:

should be forced, and when each such gap should be forced. We next discuss factors which pertain to such choices, including methods of quantifying and balancing both:
 1. the need to force a gap in a band (a factor sometimes referred to herein as "urgency");
 and
 2. the degree to which forcing a gap would have perceptual impact (a factor sometimes referred to herein as "perceptual freedom").

In some embodiments of the invention, urgency and perceptual freedom estimates are determined for each of $B_{count}$ frequency bands of a playback signal, in an effort to insert forced gaps in a manner which minimizes overall urgency and attains an acceptably low (e.g., minimizes) perceptual cost (e.g., in a non-optimal, statistical sense). For example, this may be implemented as follows. A discrete probability distribution P is defined over the $B_{count}$ possible outcomes (i.e., a probability is defined for selection, at a specific time, of each one of the $B_{count}$ bands). Once per each time interval, $w_f$, this distribution P is sampled randomly to select the band in which to insert (in the corresponding time interval) a forced gap (e.g., having parameters as described with reference to FIGS. 4, 5, and 6). By randomly selecting from the distribution, the perceptual impact of the gaps is lowered, since less predictable and structured audio artifacts are produced. The distribution P can be determined in any of a number of different ways. Preferably, the distribution P balances and prioritizes bands that have a high need (urgency) for gaps to be forced, and low perceptual impact once forced. For example, one such distribution is:

$$P_k = \frac{P'_k}{\sum_l P'_l},$$

where $$P'_k = \delta * U_k + (1-\delta) * F_k,$$

and where $U_k$ and $F_k$ are values indicative of urgency and perceptual freedom, respectively, for the "k"th band, $P'_k$ is the (non-normalized) probability of selection of the "k"th

TABLE 1

Examples of parameters for forcing gaps in bands of a playback signal.

| Parameter | Default | Minimum | Maximum | Units | Purpose |
|---|---|---|---|---|---|
| $B_{count}$ | 49 | 20 | 128 | — | Number of discrete groupings of frequency bins, referred to as "bands" |
| Z | −12 | −12 | −18 | dB | Maximum attenuation applied in the forced gap in a band. |
| t1 | 8 | 5 | 15 | Milliseconds | Time to ramp gain down to −Z dB at the center frequency of a band once a forced gap is triggered. |
| t2 | 80 | 40 | 120 | Milliseconds | Time to apply attenuation −Z dB after t1 seconds. |
| t3 | 8 | 5 | 15 | Milliseconds | Time to ramp gain up to 0 dB after t1 + t2 elapses. |

Preferably, each forced gap introduced (in a frequency band of playback content) is introduced in accordance with a discrete selection from a predetermined banding structure (e.g., that of FIG. 6) for insertion of the forced gap and a selected time interval in which the forced gap is to be inserted.

To implement typical embodiments of the invention, choices are made regarding in which discrete frequency band(s), of a set of $B_{count}$ bands of a playback signal, gap(s)

band, δ is a parameter indicative of relative importance of urgency and perceptual freedom considerations, and the summation is over all the frequency bands (so that $P_k$ is the normalized version of $P'_k$ for the "k"th band).

Figure 7:
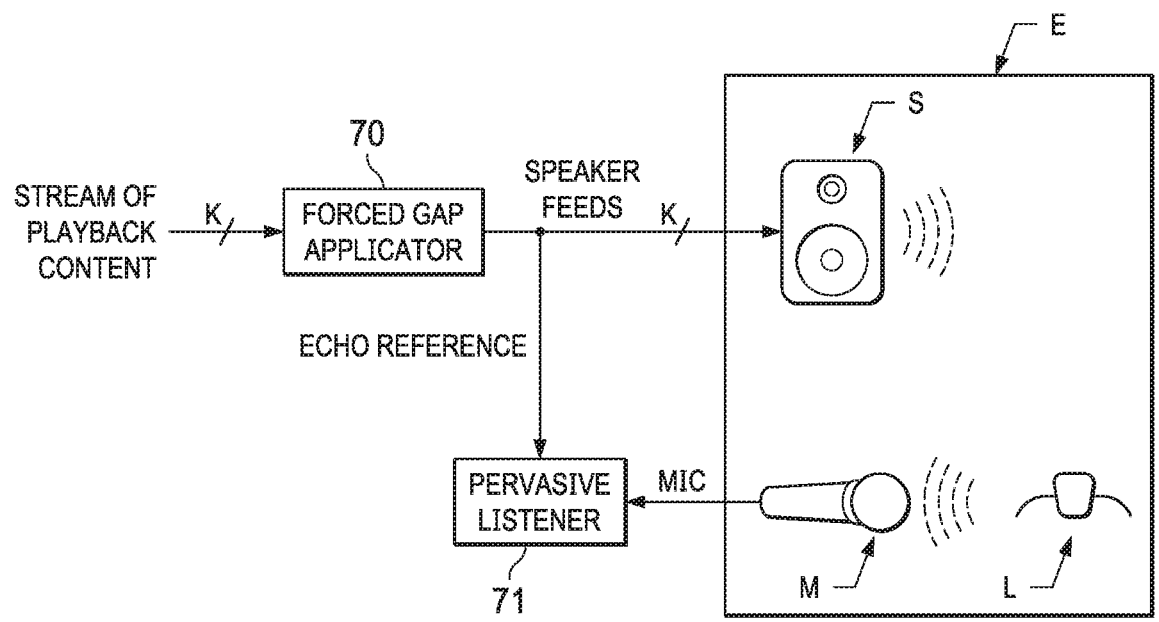
FIG. 7 is a block is a block diagram of an embodiment of the inventive pervasive listening system which is configured to insert gaps (forced gaps) into an audio signal.

FIG. 7 is a block diagram of a system configured to insert forced gaps in an audio signal (sometimes referred to as an audio playback signal) in aid of a pervasive listening method (implemented by pervasive listening subsystem 71). Pervasive listening subsystem 71 is sometimes referred to herein as a "pervasive listener." Forced gap application subsystem (forced gap applicator) 70 of the FIG. 7 system is coupled and configured to insert forced gaps in the audio playback signal. Typically, the audio playback signal comprises K channels (each indicative of a different channel of playback content), where K is a positive integer, and forced gap applicator 70 is configured to analyze these channels, and to force gaps in one or more of them during each of a sequence of time intervals. Thus, the K audio playback channels output from subsystem 70 may have forced gaps therein.

Each channel of the audio signal input to subsystem 70 is indicative of audio content (sometimes referred to herein as media content or playback content), and is intended to undergo playback to generate sound (in environment E) indicative of the audio content. Each channel of the audio signal output from subsystem 70 may be a speaker feed, or another element of the system may generate a speaker feed in response to each channel of the audio signal output from subsystem 70. The K speaker feed(s) are asserted to speaker system S (including at least one speaker) in playback environment E.

Pervasive listening subsystem 71 (which, in some implementations, is a pervasive listening application running on an appropriately programmed processor) is coupled and configured to monitor sound ("non-playback" sound) in playback environment E, other than playback sound emitted from speaker system S (in response to the speaker feed(s) in environment E. Specifically, microphone M in environment E captures sound in the environment E, and asserts to subsystem 71 a microphone output signal Mic indicative of the captured sound. The captured sound includes playback sound emitted from speaker system S, and non-playback sound which may be or include background noise, and/or speech by (or other sound indicative of activity, or mere presence, of) at least one human user L in the environment E.

By monitoring non-playback sound in environment E which is revealed by forced gaps (i.e., in frequency bands and time intervals corresponding to the forced gaps) which have been inserted in the playback content in accordance with the invention, the performance of subsystem 71 is improved relative to the performance which it could attain without insertion of the forced gaps.

Optionally, pervasive listening subsystem 71 is coupled and configured also to generate the audio playback signal which is input to forced gap applicator 70 (e.g., for the purpose of improving in some respect audio signal playback by speaker system S) in response to at least one result of the monitoring performed by said subsystem 71. Subsystem 71 may generate the audio playback signal by modifying an input audio playback signal (e.g., as does pervasive listener subsystem 72 of the system of FIG. 8 to be described below). For example, in some implementations, pervasive listener subsystem 71 is coupled and configured to perform processing (e.g., noise compensation) on an input audio signal (typically comprising K channels of playback content) to generate a processed audio playback signal (typically comprising K channels of processed playback content) input to forced gap applicator 70 (e.g., as is pervasive listener subsystem 72 of the system of FIG. 8 to be described below). The processed audio playback signal is provided to forced gap applicator 70, and the output of the forced gap applicator is (or is used to generate) a set of K speaker feeds which is asserted to speaker subsystem S.

Speaker system S (including at least one speaker) is coupled and configured to emit sound (in playback environment E) in response to each speaker feed determined by the output of subsystem 70. The output of subsystem 70 may consist of a single playback channel, or two or more playback channels. In typical operation, each speaker of speaker system S receives a speaker feed indicative of the playback content of a different channel of the output of subsystem 70. In response, speaker system S emits sound in playback environment E. Typically, the sound is perceived by at least one user (L) present in environment E.

Microphone output signal "Mic" of FIG. 7 is generated using microphone M which is present in the same acoustic space (environment E of FIG. 7) as is speaker system S and typically also at least one user (a human listener) L.

Pervasive listening subsystem 71 is provided with the microphone output signal Mic. In response to the microphone output signal Mic, subsystem 71 monitors (or attempts to monitor) non-playback sound in environment E. The non-playback sound is sound other than the sound emitted by speaker system S. For example, the non-playback sound may be background noise and/or sound uttered by (or resulting from activity of) a user L. Subsystem 71 is also provided the K channels (which may include forced gaps) which are output from forced gap application subsystem 70. The K channels provided to subsystem 71 are sometimes referred to herein as K channels of "echo reference." Each of the echo reference channels may contain forced gaps which have been automatically forced therein by subsystem 70, to aid subsystem 71 in its monitoring task.

In typical implementations, forced gap applicator 70 inserts gaps in the audio playback signal in response to urgency data values indicative of the urgency (in each of a number of frequency bands, in each of a sequence of time intervals) for insertion of the gaps. In some implementations, forced gap applicator 70 determines the urgency data values either using a predetermined, fixed estimate for urgency for each of the frequency bands (e.g., as indicated by a probability distribution of the type described above), or an estimate of urgency for each band (in each of the time intervals) generated by forced gap applicator 70 (e.g., based on the playback signal input to applicator 70 and optionally also on history of forced gap insertion by applicator 70).

Figure 8:
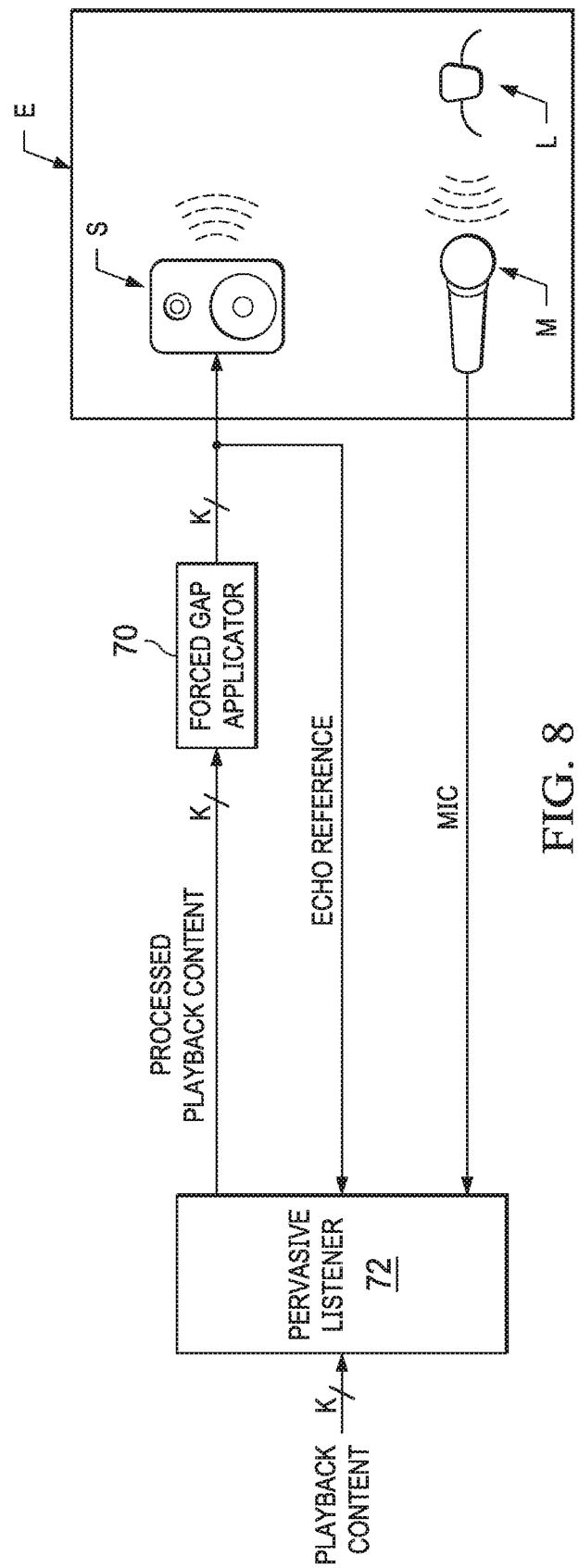
FIG. 8 is a block is a block diagram of another embodiment of the inventive pervasive listening system which is configured to insert gaps (forced gaps) into an audio signal.

FIG. 8 is a block diagram of another system configured to insert forced gaps in an audio playback signal in aid of a pervasive listening method (implemented by pervasive listening subsystem 72). The FIG. 8 system is identical to that of FIG. 7 except in that pervasive listening subsystem 72 of FIG. 8 (coupled as shown) replaces pervasive listening subsystem 71 of FIG. 7, and subsystem 72 generates the playback signal which is input to forced gap applicator 70 (e.g., by modifying an input audio playback signal which is provided as input to subsystem 72).

Pervasive listening subsystem 72 (which, in some implementations, is a pervasive listening application running on an appropriately programmed processor) is coupled and configured to monitor non-playback sound in playback environment E. The non-playback sound is sound, other than playback sound emitted from speaker system S (in response to the speaker feed(s) asserted thereto) in environment E. Specifically, microphone M in environment E captures sound in the environment E, and asserts to subsystem 72 a microphone output signal Mic indicative of the captured sound. The captured sound includes playback sound emitted from speaker system S, and non-playback sound. The non-playback sound may be or include background noise, and/or speech by (or other sound indicative of activity, or mere presence, of) at least one human user L in the environment E.

By monitoring non-playback sound in environment E which is revealed by forced gaps (i.e., in frequency bands and time intervals corresponding to the forced gaps) inserted in the playback content by forced gap application subsystem 70 in accordance with the invention, the performance of subsystem 72 is improved relative to the performance which it could attain without insertion of the forced gaps.

Pervasive listening subsystem 72 is also coupled and configured to perform audio signal processing (e.g., noise compensation) on an input audio signal (typically comprising K channels of playback content) to generate a processed audio playback signal (typically comprising K channels of processed playback content) which is input to forced gap applicator 70 (e.g., for the purpose of improving in some respect the audio signal playback by speaker system S) in response to at least one result of the monitoring performed by said subsystem 72. The processed audio playback signal is provided to forced gap applicator 70, and the output of the forced gap applicator is (or is used to generate) a set of K speaker feeds which is asserted to speaker subsystem S. One example of an implementation of subsystem 72 is noise compensation subsystem 62 together with noise estimation subsystem 64 of the FIG. 11 system to be described below.

Figure 9:
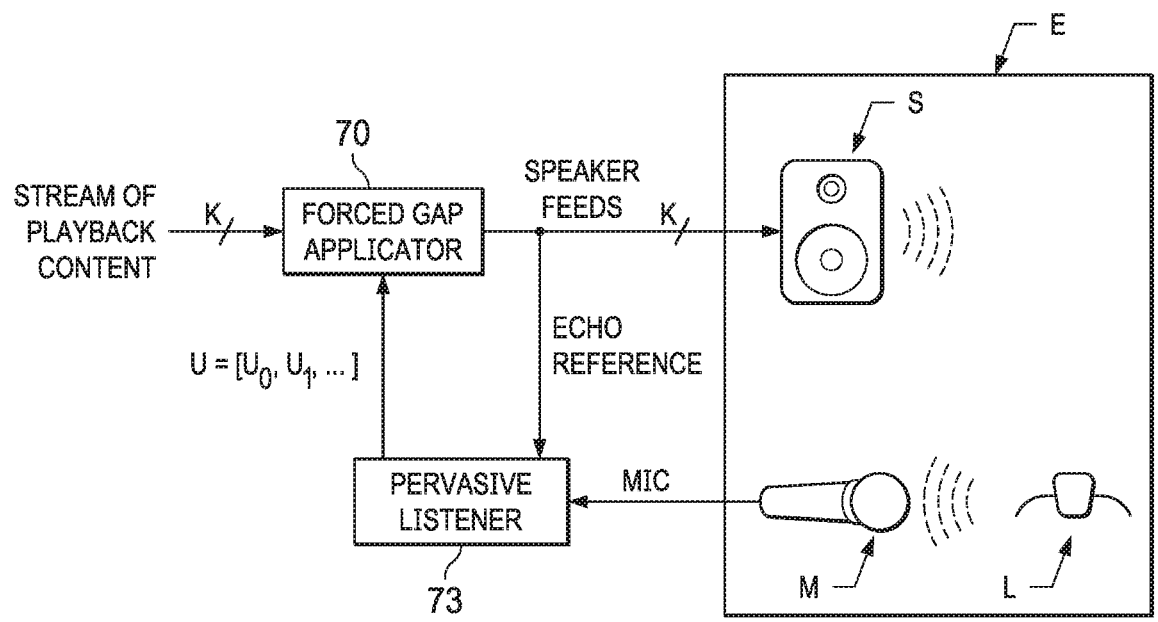
FIG. 9 is a block is a block diagram of another embodiment of the inventive pervasive listening system which is configured to insert gaps (forced gaps) into an audio signal.

FIG. 9 is a block diagram of another system configured to insert forced gaps in an audio playback signal in aid of a pervasive listening method (implemented by pervasive listening subsystem 73). The FIG. 9 system is identical to that of FIG. 7 except in that pervasive listening subsystem 73 of FIG. 9 (coupled as shown) replaces pervasive listening subsystem 71 of FIG. 7.

In the FIG. 9 system, forced gap applicator 70 operates in response to an urgency signal, U, asserted thereto by pervasive listening subsystem 73, so that pervasive listening subsystem 73 has control over forced gap insertion based on the need for gaps in the playback signal. It is expected that different implementations of pervasive listening subsystem 73 will have differing requirements over the quality and numeracy of gaps in frequency bands of the microphone output signal Mic. For instance, in the case that pervasive listener 73 implements a pervasive listening method which depends on occurrence or non-occurrence of speech utterances by a user L in playback environment E, the pervasive listener 73 will only be interested in gaps that occur within the typical frequency ranges of speech. Typically, the urgency signal U is indicative of a sequence of urgency value sets $[U_0, U_1, \ldots U_N]$, where N is a predetermined number of frequency bands (of the full frequency range of the playback signal) in which subsystem 70 may insert forced gaps (i.e., with one forced gap inserted in each of the bands), and $U_i$ is an urgency value for the "i"th band in which subsystem 70 may insert a forced gap. The urgency values of each urgency value set (corresponding to a time) may be generated in accordance with any embodiment of the inventive method for determining urgency, and are indicative of urgency for insertion (by subsystem 70) of forced gaps (at the time) in the N bands.

In some implementations of subsystem 73, the urgency signal U is indicative of a fixed (time invariant) urgency value set $[U_0, U_1, \ldots U_N]$ determined by a probability distribution defining a probability of gap insertion for each of the N frequency bands. Thus, in response to such a fixed urgency value set, subsystem 70 operates to insert fewer forced gaps (on the average) in those bands which have lower urgency values (i.e., lower probability values determined by the probability distribution), and to insert more forced gaps (on the average) in those bands which have higher urgency values (i.e., higher probability values). In some implementations of subsystem 73, the urgency signal U is indicative of a sequence of urgency value sets $[U_0, U_1, \ldots U_N]$, e.g., a different urgency value set for each different time in the sequence. Each such different urgency value set may be determined by a different probability distribution for each of the different times. Various examples of urgency signal U and urgency values indicated thereby are described in more detail below.

Figure 10:
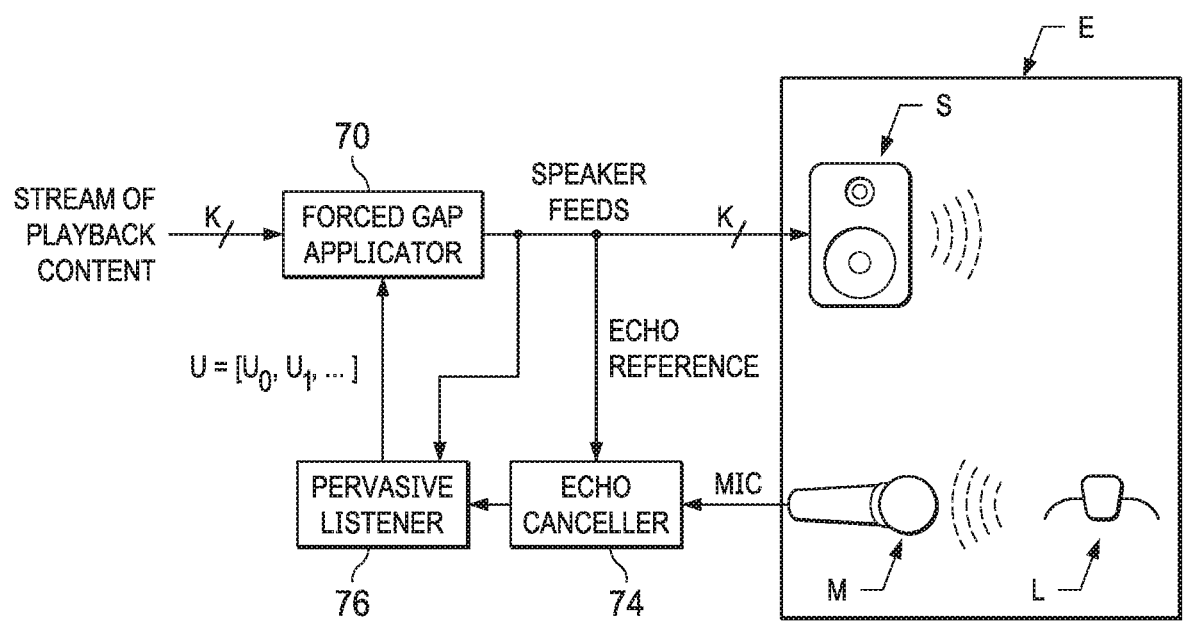
FIG. 10 is a block is a block diagram of another embodiment of the inventive pervasive listening system which is configured to insert gaps (forced gaps) into an audio signal.

The FIGS. 7, 8, and 9 embodiments (e.g., the pervasive listening subsystem of each of FIGS. 7, 8, and 9) may (but need not) implement acoustic echo cancellation. FIG. 10 is a block diagram of another system configured to insert forced gaps in an audio playback signal in aid of a pervasive listening method (implemented by pervasive listening subsystem 76). The FIG. 10 system is identical to that of FIG. 9 except in that pervasive listening subsystem 76 of FIG. 10 (coupled as shown) replaces pervasive listening subsystem 73 of FIG. 9, and in that the FIG. 10 embodiment includes echo cancelling subsystem (echo canceler) 74 which performs echo cancellation on the microphone output signal Mic, e.g., in an effort to prevent unintentional echo leaks to pass through the system. The output of forced gap application subsystem 70 (which may include forced gaps) is provided as an echo reference to echo canceller 74. In typical implementations, echo canceller 74 is implemented as are below-described elements 26, 32, 34, and 35 of the FIG. 12 system. Alternatively, echo canceller 74 may be implemented in another (e.g., conventional) manner.

Figure 11:
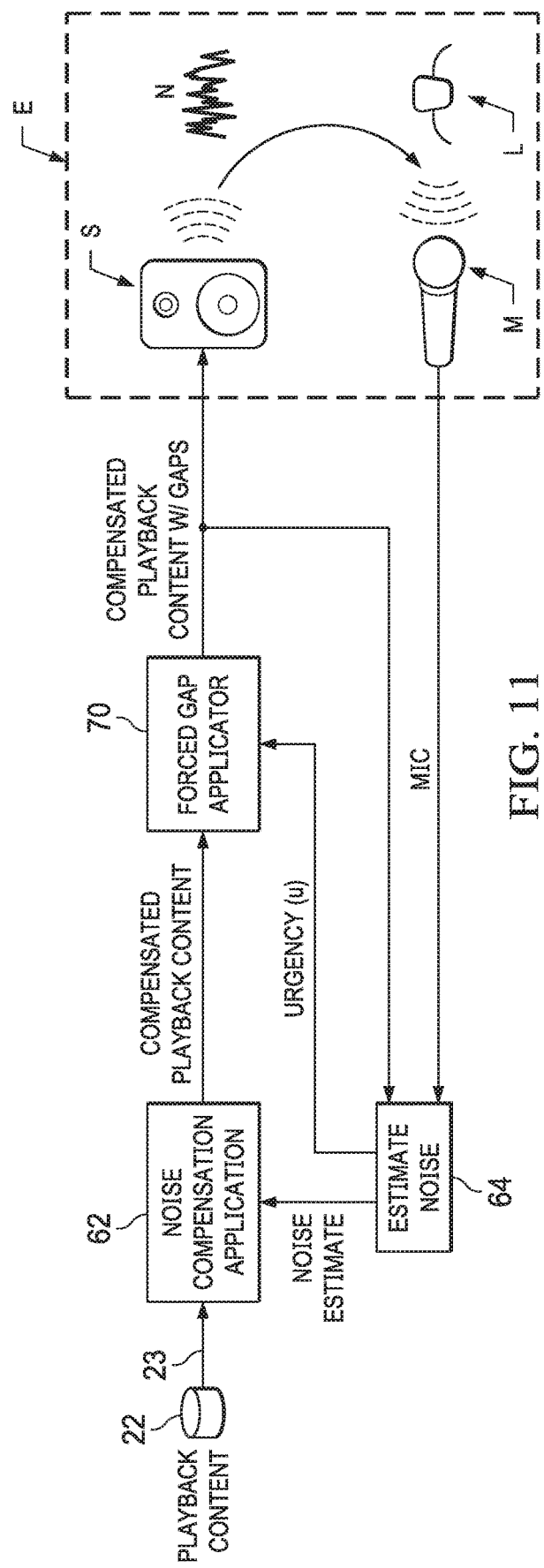
FIG. 11 is a block diagram of an embodiment of the inventive system for generating a background noise estimate for each frequency band of a microphone output signal, and using the noise estimates to perform noise compensation on an input audio signal to generate a compensated audio signal, including by inserting gaps (forced gaps) into the compensated audio signal.

FIG. 11 is a block diagram of a noise compensation system including noise estimation subsystem (noise estimator) 64, noise compensation gain application subsystem (noise compensation subsystem) 62, and forced gap application subsystem (forced gap applicator) 70. The FIG. 11 system is an example of an implementation of the above-described FIG. 8 system, in which noise compensation subsystem 62 together with noise estimator 64 of FIG. 11 correspond to (and implement) pervasive listening subsystem 72 of FIG. 8, and in which noise estimator 64 is configured to provide an urgency signal, U, to forced gap applicator 70. Urgency signal U may be of any of the types mentioned above with reference to FIG. 9 or described elsewhere herein. In the FIG. 11 system, forced gap application subsystem 70 operates in response to urgency signal U, so that noise estimator 64 has control over forced gap insertion based on the need for gaps in the playback signal.

Noise compensation systems (e.g., that of FIG. 11) can function with weak or non-existent echo cancellation (e.g., when implemented as described in above-referenced U.S. Provisional Patent Application No. 62/663,302), but may suffer from content-dependent response times especially in the case of music, TV, and movie content. The time taken by a noise compensation system to respond to changes in the profile of background noise in the playback environment is critical to user experience, more so than the accuracy of the actual noise estimate. When the playback content provides few or no gaps in which to glimpse the background noise, the noise estimates remain fixed even when noise conditions change. While interpolating and imputing missing values in a noise estimate spectrum is typically helpful, it is still possible for large regions of the noise estimate spectrum to become locked up and stale.

Typical embodiments of forced gap applicator 70 of the FIG. 11 system are operable to provide forced gaps (in the playback signal) which occur sufficiently often (in each frequency band of interest of the output of forced gap applicator 70) that background noise estimates (by noise estimator 64) can be updated sufficiently often to respond to typical changes in profile of background noise N in playback environment E. Subsystem 70 is configured to introduce forced gaps in the compensated audio playback signal (having K channels, where K is a positive integer) which is output from noise compensation subsystem 62. Noise estimator 64 is configured to search for gaps (including forced gaps inserted by subsystem 70) in each channel of the compensated audio playback signal, and to generate noise estimates for the frequency bands (and in the time intervals) in which the gaps occur. Noise estimator 64 is also configured to use the resulting information regarding detected gaps to generate (and assert to forced gap application subsystem 63) the urgency signal, whose urgency values track the urgency for inserting forced gaps in frequency bands of the compensated audio playback signal.

Without forced gap application subsystem 70, the FIG. 11 system resembles a conventional noise compensation system (e.g., that of FIG. 1), with noise estimator 64 accepting both microphone feed Mic (the output of microphone M in playback environment E) and a reference of the compensated audio playback signal (the input to speaker system S in playback environment E). The noise estimates generated in subsystem 64 are provided to noise compensation subsystem 62, which applies compensation gains to input playback signal 23 (from content source 22) to level each frequency band thereof to the desired playback level. The noise compensated audio playback signal (output from subsystem 62) and an urgency metric per band (indicated by the urgency signal output from subsystem 64) are provided to forced gap applicator 70, which forces gaps in the compensated playback signal (preferably in accordance with an optimization process). Speaker feed(s), each indicative of the content of a different channel of the noise compensated playback signal (output from forced gap applicator 70), are (is) provided to each speaker of speaker system S.

Although some implementations of the FIG. 11 system may perform echo cancellation (e.g., as implemented by elements 26, 32, 34, and 35 of FIG. 12) as an element of the noise estimation that it performs, other implementations of the FIG. 11 system do not perform echo cancellation. Elements for implementing echo cancellation are not specifically shown in FIG. 11.

In FIG. 11, the typically implemented time domain-to-frequency domain (and/or frequency domain-to-time domain) transformations of signals are not shown, but the application of noise compensation gains (in subsystem 62), analysis of content for gap forcing (in noise estimator 64 and/or forced gap applicator 70) and insertion of forced gaps (by forced gap applicator 70) are typically implemented in the same transform domain for convenience, with the resulting output audio resynthesised to PCM (time-domain) audio before playback or further encoding for transmission.

By use of forced gap applicator 70, the number of gaps in each channel of the compensated playback signal (output from noise compensation subsystem 62 of the FIG. 11 system) is typically increased (relative to the number of gaps which would occur without use of forced gap applicator 70), so as to significantly reduce the requirements on any echo canceller implemented by the FIG. 11 system, and in some cases even to eliminate the need for echo cancellation entirely.

In the system of any of FIGS. 7-11 it is possible for simple post-processing circuitry such as time-domain peak limiting or speaker protection to be implemented between the forced gap applicator 70 and speaker system S. However post-processing with the ability to boost and compress the speaker feeds has the potential to undo or lower the quality of the forced gaps inserted by the forced gap applicator, and thus these types of post-processing are preferably implemented at a point in the signal processing path before forced gap applicator 70.

Figure 12:
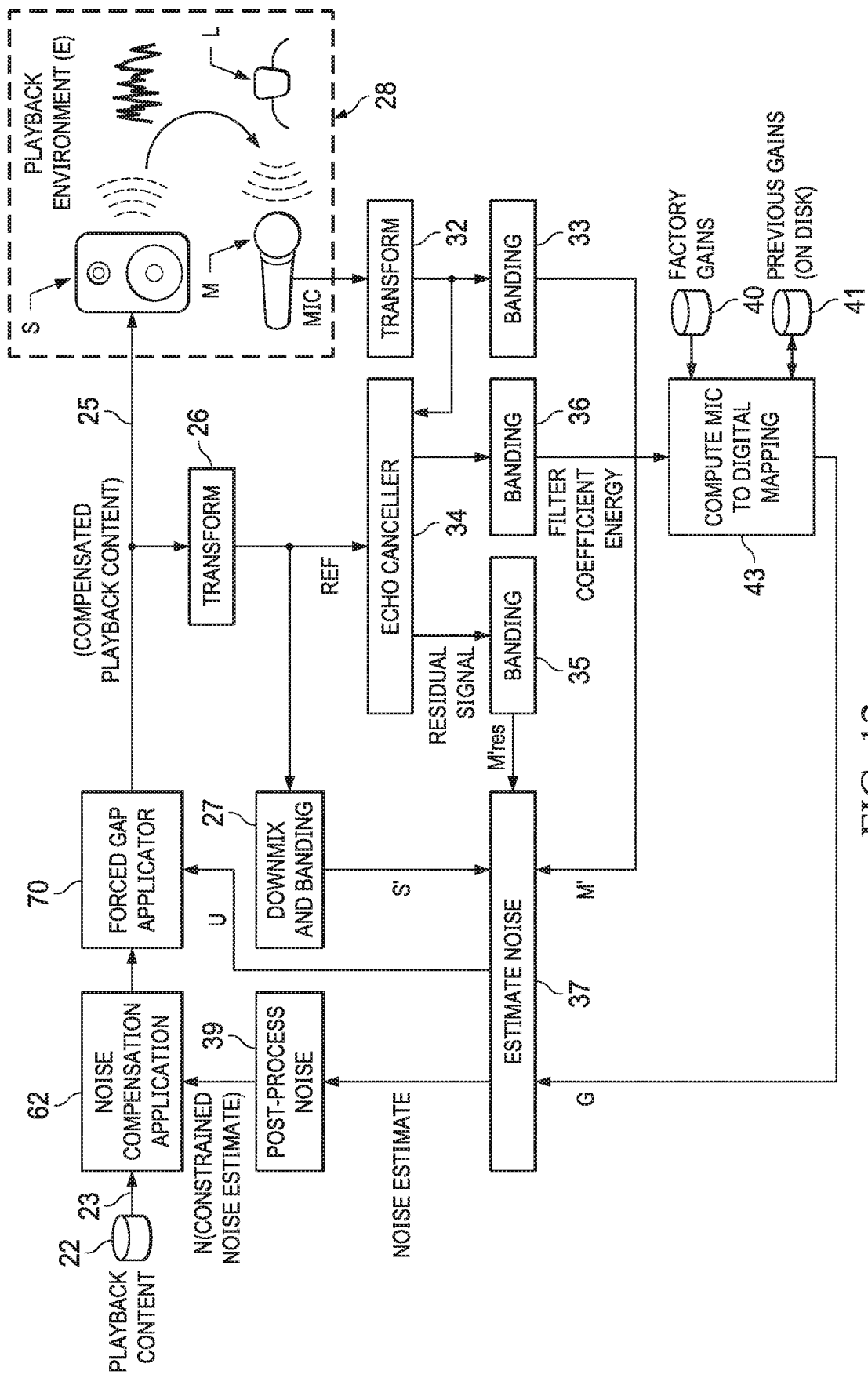
FIG. 12 is a more detailed block diagram of an example implementation of the FIG. 11 system.
Figure 13:
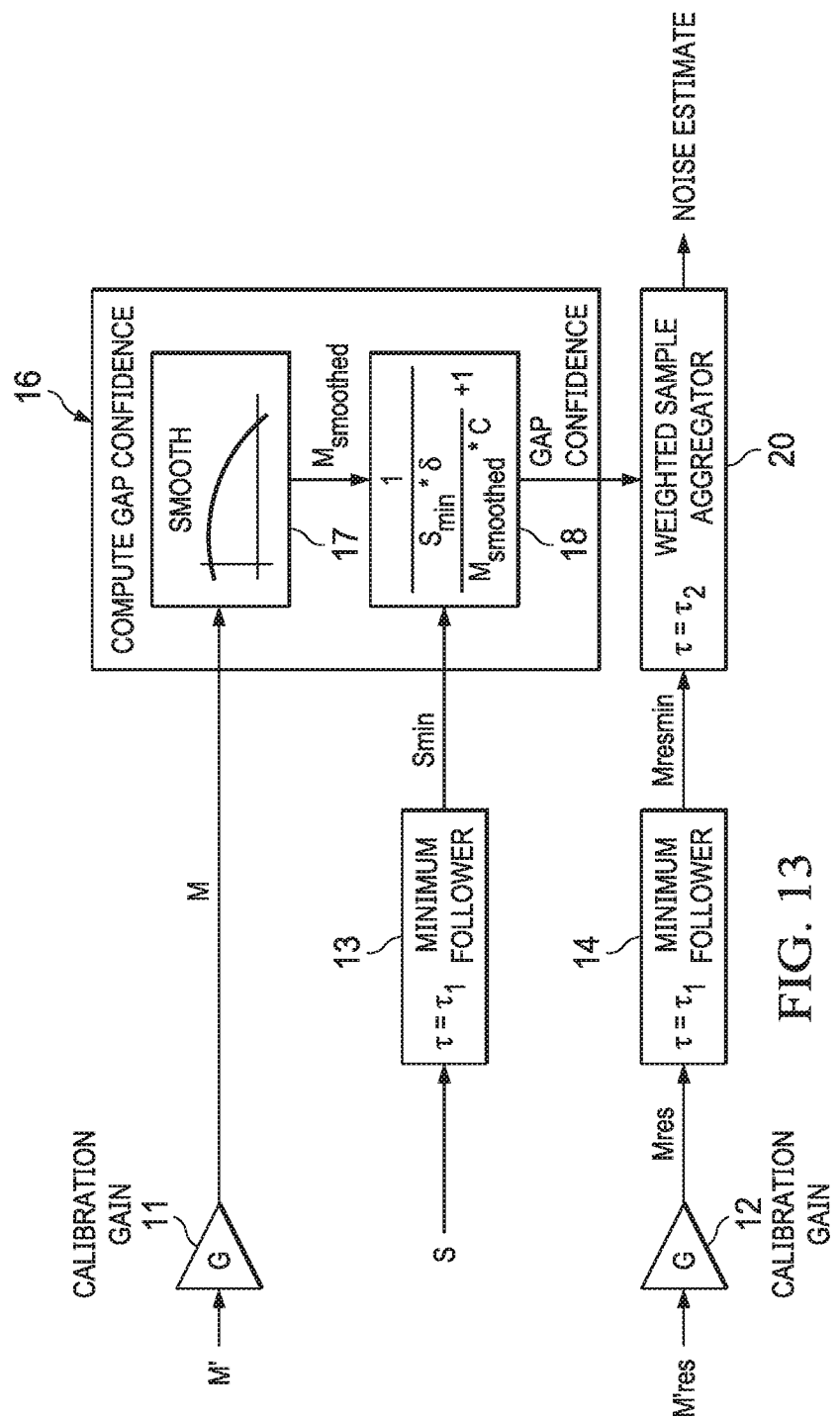
FIG. 13 is a block diagram of an example of an implementation of noise estimation subsystem 37 of the FIG. 12 system.

We next describe FIG. 12, which is a more detailed block diagram of an example implementation of the FIG. 11 system. The system of FIG. 12 is configured to generate an estimate of background noise in playback environment E and to use the noise estimate to perform noise compensation on an input audio signal. FIG. 13 is a block diagram of an example of an implementation of noise estimation subsystem 37 of FIG. 12.

Noise estimation subsystem 37 of FIG. 12 is configured to generate an estimate of background noise in playback environment E (typically a sequence of noise estimates, each corresponding to a different time interval). The FIG. 12 system also includes noise compensation subsystem 62, which is coupled and configured to perform noise compensation on input audio signal 23 (from source 22) using the noise estimate output from subsystem 37 (or a post-processed version of such noise estimate, which is output from post-processing subsystem 39 in cases in which subsystem 39 operates to modify the noise estimate output from subsystem 37) to generate a noise compensated version (playback signal 25) of input signal 23. Forced gap application subsystem 70 is configured to insert forced gaps into the output of subsystem 62 (in response to urgency signal U provided thereto from subsystem 37), thereby generating playback signal 25 (each channel of which may have forced gaps inserted therein).

Subsystem 70 of FIG. 12 is identical to subsystem 70 of FIG. 11, and operation of subsystem 62 has been described with reference to FIG. 11. Urgency signal U of FIG. 12 is identical to urgency signal U of FIG. 11, and subsystem 37 of FIG. 12 may be configured to generate signal U in any of the ways described herein for generating an urgency signal (e.g., any of the ways in which subsystem 62 of FIG. 11 may be configured to generate urgency signal U).

Subsystem 62 of FIG. 12 is identical to subsystem 62 of FIG. 11, and operation of subsystem 62 has been described with reference to FIG. 11.

The FIG. 12 system includes content source 22, which is coupled and configured to output, and provide to noise compensation subsystem 62, the audio signal 23. Signal 23 is indicative of at least one channel of audio content (sometimes referred to herein as media content or playback content), and is intended to undergo playback to generate sound (in environment E) indicative of each channel of the audio content. Audio signal 23 may be a speaker feed (or two or more speaker feeds in the case of multichannel playback content) and noise compensation subsystem 62 may be coupled and configured to apply noise compensation to each such speaker feed by adjusting the playback gains of the speaker feed. Alternatively, another element of the system may generate a speaker feed (or multiple speaker feeds) in response to audio signal 23 (e.g., noise compensation subsystem 62 may be coupled and configured to generate at least one speaker feed in response to audio signal 23 and to apply noise compensation to each speaker feed by adjusting the playback gains of the speaker feed, so that playback signal 25 consists of at least one noise compensated speaker feed). In an operating mode of the FIG. 12 system, subsystem 62 does not perform noise compensation, so that the audio content of the playback signal 25 is the same as the audio content of signal 23 (except to the extent modified by any forced gaps inserted by subsystem 70).

Speaker system S (including at least one speaker) is coupled and configured to emit sound (in playback environment E) in response to playback signal 25. Signal 25 may consist of a single playback channel, or it may consist of two or more playback channels. In typical operation, each speaker of speaker system S receives a speaker feed indicative of the playback content of a different channel of signal 25. In response, speaker system S emits sound (in playback environment E) in response to the speaker feed(s). The sound is perceived by user (a human listener) L (in environment E) as a noise-compensated version of the playback content of input signal 23.

Next, with reference to FIG. 12, we describe an embodiment of a method and system for computing a sequence of estimates of background noise level for each band of a number of different frequency bands of playback content. It should be appreciated that the elements of FIG. 12 (excluding playback environment E, speaker system S, microphone M, and user L) can be implemented in or as a processor, with those of such elements (including those referred to herein as subsystems) which perform signal (or data) processing operations implemented in software, firmware, or hardware.

A microphone output signal (e.g., signal "Mic" of FIG. 12) is generated using a microphone (e.g., microphone M of FIG. 12) occupying the same acoustic space (environment E of FIG. 12) as the user (e.g., user L of FIG. 12). It is possible that two or more microphones could be used (e.g., with their individual outputs combined) to generate the microphone output signal, and thus the term "microphone" is used in a broad sense herein to denote either a single microphone, or two or more microphones, operated to generate a single microphone output signal. The microphone output signal is indicative of both the acoustic playback signal (the playback content of the sound emitted from speaker system S of FIG. 12) and the competing background noise, and is transformed (e.g., by time-to-frequency transform element 32 of FIG. 12) into a frequency domain representation, thereby generating frequency-domain microphone output data, and the frequency-domain microphone output data is banded (e.g., by element 33 of FIG. 12) into the power domain, yielding microphone output values (e.g., values M' of FIG. 12). For each frequency band, the corresponding one of the values (one of values M') is adjusted in level using a calibration gain G to produce an adjusted value M. Application of the calibration gain G is required to correct for the level difference in the digital playback signal (the values S') and the digitized microphone output signal level (the values M'). Methods for determining G (for each frequency band) automatically and through measurement are discussed below.

Each channel of the playback content (e.g., each channel of noise compensated signal 25 of FIG. 12), which is typically multichannel playback content, is frequency transformed (e.g., by time-to-frequency transform element 26 of FIG. 12, preferably using the same transformation performed by transform element 32) thereby generating frequency-domain playback content data. The frequency-domain playback content data (for all channels) are downmixed (in the case that signal 25 includes two or more channels), and the resulting single stream of frequency-domain playback content data is banded (e.g., by element 27 of FIG. 12, preferably using the same banding operation performed by element 33 to generate the values M') to yield playback content values S' (e.g., values S' of FIG. 12). Values S' should also be delayed in time (before they are processed in accordance with an embodiment of the invention) to account for any latency (e.g., due to A/D and D/A conversion) in the hardware. This adjustment can be considered a coarse adjustment.

The FIG. 12 system can include an echo canceller 34, coupled as shown and configured to generate echo cancelled noise estimate values by performing echo cancellation on the frequency domain values output from elements 26 and 32, and a banding subsystem 35, coupled and configured to perform frequency banding on the echo cancelled noise estimate values (residual values) output from echo canceller 34 to generate banded, echo cancelled noise estimate values M'res (including a value M'res for each frequency band).

In the case that signal 25 is multi-channel signal (comprising Z playback channels), a typical implementation of echo canceller 34 receives (from element 26) multiple streams of frequency-domain playback content values (one stream for each channel), and adapts a filter $W'_i$ (corresponding to filter W' of FIG. 2) for each playback channel. In this case, the frequency domain representation of the microphone output signal Y can be represented as $W_1X+W_2X+ \ldots +W_ZX+N$, where each $W_i$ is a transfer function for a different one (the "i"th one) of the Z speakers. Such an implementation of echo canceller 34 subtracts each $W'_iX$ estimate (one per channel) from the frequency domain representation of the microphone output signal Y, to generate a single stream of echo cancelled noise estimate (or "residual") values corresponding to echo cancelled noise estimate values Y' of FIG. 2.

Figure 2:
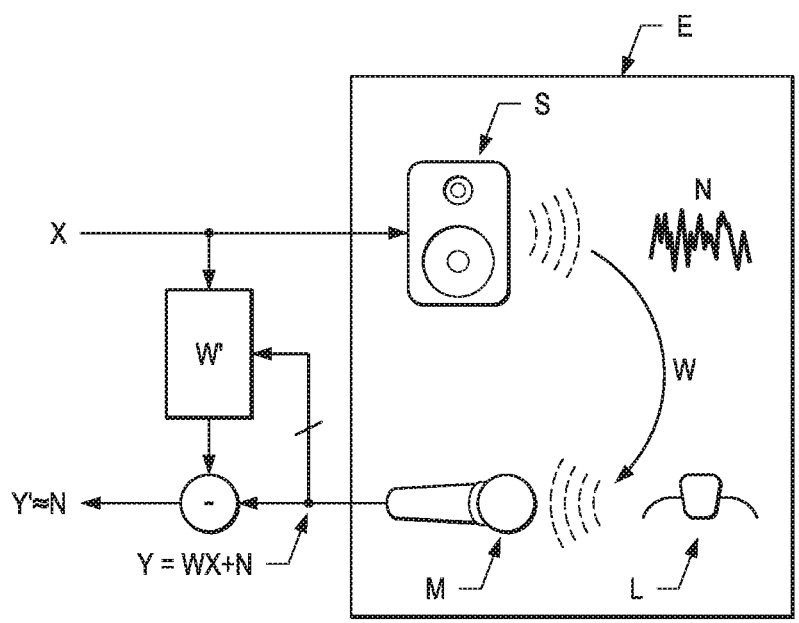
FIG. 2 is a block diagram of a conventional system for generating a noise estimate, in accordance with the conventional method known as echo cancellation, from a microphone output signal. The microphone output signal is generated by capturing sound (indicative of playback content) and noise in a playback environment.

The filter coefficients of each adaptive filter employed by echo canceller 34 to generate the echo cancelled noise estimate values (i.e., each adaptive filter implemented by echo canceller 34 which corresponds to filter W' of FIG. 2) are banded in banding element 36. The banded filter coefficients are provided from element 36 to subsystem 43, for use by subsystem 43 to generate gain values G for use by subsystem 37.

Optionally, echo canceller 34 is omitted (or does not operate), and thus no adaptive filter values are provided to banding element 36, and no banded adaptive filter values are provided from 36 to subsystem 43. In this case, subsystem 43 generates the gain values G in one of the ways (described below) without use of banded adaptive filter values.

If an echo canceller is used (i.e. if the FIG. 12 system includes and uses elements 34 and 35 as shown in FIG. 12), the residual values output from echo canceller 34 are banded (e.g., in subsystem 35 of FIG. 12) to produce the banded noise estimate values M'res. Calibration gains G (generated by subsystem 43) are applied to the values M'res (i.e., gains G includes a set of band-specific gains, one for each band, and each of the band-specific gains is applied to the values M'res in the corresponding band) to bring the signal (indicated by values M'res) into the same level domain as the playback signal (indicated by values S'). For each frequency band, the corresponding one of the values M'res is adjusted in level using a calibration gain G to produce an adjusted value Mres.

If no echo canceller is used (i.e., if echo canceller 34 is omitted or does not operate), the values M'res (in the description herein of FIGS. 12 and 13) are replaced by the values M'. In this case, banded values M' (from element 33) are asserted to the input of gain stage 12 of FIG. 13 (in place of the values M'res shown in FIG. 13) as well as to the input of gain stage 11 of FIG. 13. Gains G are applied (by gain stage 12 of FIG. 13) to the values M' to generate adjusted values M, and the adjusted values M (rather than adjusted values Mres, as shown in FIG. 13) are handled by subsystem 20 (with the gap confidence values) in the same manner as (and instead of) the adjusted values Mres, to generate the noise estimate.

In typical implementations (including that shown in FIG. 13), noise estimation subsystem 37 is configured to perform minimum following on the playback content values S' to locate gaps in (i.e., determined by) the adjusted versions (Mres) of the noise estimate values M'res. Preferably, this is implemented in a manner to be described with reference to FIG. 13.

In the implementation shown in FIG. 13, subsystem 37 includes a pair of minimum followers (13 and 14), both of which operate with the same sized analysis window. Minimum follower 13 is coupled and configured to run over the values S' to produce the values $S_{min}$ which are indicative of the minimum value (in each analysis window) of the values S'. Minimum follower 14 is coupled and configured to run over the values Mres to produce the values $M_{resmin}$, which are indicative of the minimum value (in each analysis window) of the values Mres. Since the values S', M, and Mres are at least roughly time aligned, in a gap (e.g., a forced gap inserted by subsystem 70) in playback content (indicated by comparison of the playback content values S' and the microphone output values M):

minima in the values Mres (the echo canceller residual) can confidently be considered to indicate estimates of noise in the playback environment; and minima in the M (microphone output signal) values can confidently be considered to indicate estimates of noise in the playback environment.

At times other than during a gap in playback content, minima in the values Mres (or the values M) may not be indicative of accurate estimates of noise in the playback environment.

In response to microphone output signal (M) and the values of $S_{min}$, subsystem 16 generates gap confidence values. Sample aggregator subsystem 20 is configured to use the values of $M_{resmin}$ (or the values of M, in the case that no echo cancellation is performed) as candidate noise estimates, and to use the gap confidence values (generated by subsystem 16) as indications of the reliability of the candidate noise estimates.

More specifically, sample aggregator subsystem 20 of FIG. 13 operates to combine the candidate noise estimates ($M_{resmin}$) together in a fashion weighted by the gap confidence values (which have been generated in subsystem 16) to produce a final noise estimate for each analysis window (i.e., the analysis window of aggregator 20, having length τ2, as indicated in FIG. 13), with weighted candidate noise estimates corresponding to gap confidence values indicative of low gap confidence assigned no weight, or less weight than weighted candidate noise estimates corresponding to gap confidence values indicative of high gap confidence. Subsystem 20 thus uses the gap confidence values to output a sequence of noise estimates (a set of current noise estimates, including one noise estimate for each frequency band, for each analysis window).

A simple example of subsystem 20 is a minimum follower (of gap confidence weighted samples), e.g., a minimum follower that includes candidate samples (values of $M_{resmin}$) in the analysis window only if the associated gap confidence is higher than a predetermined threshold value (i.e., subsystem 20 assigns a weight of one to a sample $M_{resmin}$ if the gap confidence for the sample is equal to or greater than the threshold value, and subsystem 20 assigns a weight of zero to a sample $M_{resmin}$ if the gap confidence for the sample is less than the threshold value). Other implementations of subsystem 20 otherwise aggregate (e.g., determine an average of, or otherwise aggregate) gap confidence weighted samples (values of $M_{resmin}$, each weighted by a corresponding one of the gap confidence values, in an analysis window). An exemplary implementation of subsystem 20 which aggregates gap confidence weighted samples is (or includes) a linear interpolator/one pole smoother with an update rate controlled by the gap confidence values.

Subsystem 20 may employ strategies that ignore gap confidence at times when incoming samples (values of $M_{resmin}$) are lower than the current noise estimate (determined by subsystem 20), in order to track drops in noise conditions even if no gaps are available.

Preferably, subsystem 20 is configured to effectively hold onto noise estimates during intervals of low gap confidence until new sampling opportunities arise as determined by the gap confidence. For example, in a preferred implementation of subsystem 20, when subsystem 20 determines a current noise estimate (in one analysis window) and then the gap confidence values (generated by subsystem 16) indicate low confidence that there is a gap in playback content (e.g., the gap confidence values indicate gap confidence below a predetermined threshold value), subsystem 20 continues to output that current noise estimate until (in a new analysis window) the gap confidence values indicate higher confidence that there is a gap in playback content (e.g., the gap confidence values indicate gap confidence above the threshold value), at which time subsystem 20 generates (and outputs) an updated noise estimate. By so using gap confidence values to generate noise estimates (including by holding onto noise estimates during intervals of low gap confidence until new sampling opportunities arise as determined by the gap confidence) in accordance with preferred embodiments of the invention, rather than relying only on candidate noise estimate values output from minimum follower 14 as a sequence of noise estimates (without determining and using gap confidence values) or otherwise generating noise estimates in a conventional manner, the length for all employed minimum follower analysis windows (i.e., τ1, the analysis window length of each of minimum followers 13 and 14, and τ2, the analysis window length of aggregator 20, if aggregator 20 is implemented as a minimum follower of gap confidence weighted samples) can be reduced by about an order of magnitude over traditional approaches, improving the speed at which the noise estimation system can track the noise conditions when gaps do arise.

As noted herein, noise estimator 37 is preferably also configured to generate and report (to forced gap applicator 70) an urgency signal U indicative of urgency values. Examples of such an urgency signal (and the manner in which such examples may be generated) are described herein.

With reference again to FIG. 12, we describe in more detail additional elements of the implementation (shown in FIG. 12) of a noise estimation system. As noted above, noise compensation is performed (by subsystem 62) on playback content 23 using a noise estimate spectrum produced by noise estimator subsystem 37. The output of subsystem 62 is provided to forced gap applicator 70 which (in typical operation) inserts forced gaps in each channel thereof, thereby generating noise compensated playback content 25. A speaker feed determined from noise compensated playback content 25 is played over speaker system S to a human listener (e.g., user L) in playback environment E. Microphone M in the same acoustic environment (environment E)

as the human listener receives both the environmental (surrounding) noise and the playback content (echo).

The noise compensated playback content 25 is transformed (in element 26), and downmixed and frequency banded (in element 27) to produce the values S'. The microphone output signal is transformed (in element 32) and banded (in element 33) to produce the values M'. If an echo canceller (34) is employed, the residual signal (echo cancelled noise estimate values) from the echo canceller is banded (in element 35) to produce the values Mres'.

Subsystem 43 determines the calibration gain G (for each frequency band) in accordance with a microphone to digital mapping, which captures the level difference per frequency band between the playback content in the digital domain at the point (e.g., the output of time-to-frequency domain transform element 26) it is tapped off and provided to the noise estimator, and the playback content as received by the microphone. Each set of current values of the gain G is provided from subsystem 43 to noise estimator 37.

Subsystem 43 has access to at least one of the following three sources of data:

factory preset gains (stored in memory 40);

the state of the gains G generated (by subsystem 43) during the previous session (and stored in memory 41);

if an AEC (e.g., echo canceller 34) is present and in use, banded AEC filter coefficient energies (e.g., those which determine the adaptive filter, corresponding to filter W' of FIG. 2, implemented by the echo canceller). These banded AEC filter coefficient energies (e.g., those provided from banding element 36 to subsystem 43 in the FIG. 12 system) serve as an online estimation of the gains G.

If no AEC is employed (e.g., if a version of the FIG. 12 system is employed which does not include echo canceller 34), subsystem 43 generates the calibration gains G from the gain values in memory 40 or 41.

Thus, in some embodiments, subsystem 43 is configured such that the FIG. 12 system performs self-calibration by determining calibration gains (e.g., from banded AEC filter coefficient energies provided from banding element 36) for application by subsystem 37 to playback signal, microphone output signal, and echo cancellation residual values, to implement noise estimation.

With reference again to FIG. 12, the sequence of noise estimates produced by noise estimator 37 is optionally post-processed (in subsystem 39), including by performance of one or more of the following operations thereon:

imputation of missing noise estimate values from a partially updated noise estimate;

constraining of the shape of the current noise estimate to preserve timbre; and constraining of the absolute value of current noise estimate.

The microphone to digital mapping performed by subsystem 43 to determine the gain values G captures the level difference (per frequency band) between the playback content in the digital domain (e.g., the output of time-to-frequency domain transform element 26) at the point it is tapped off for provision to the noise estimator, and the playback content as received by the microphone. The mapping is primarily determined by the physical separation and characteristics of the speaker system and microphone, as well as the electrical amplification gains used in the reproduction of sound and microphone signal amplification.

In the most basic instance, the microphone to digital mapping may be a pre-stored factory tuning, measured during production design over a sample of devices, and re-used for all such devices being produced.

When an AEC (e.g., echo canceller 34 of FIG. 12) is used, more sophisticated control over the microphone to digital mapping is possible. An online estimate of the gains G can be determined by taking the magnitude of the adaptive filter coefficients (determined by the echo canceller) and banding them together. For a sufficiently stable echo canceller design, and with sufficient smoothing on the estimated gains (G'), this online estimate can be as good as an offline pre-prepared factory calibration. This makes it possible to use estimated gains G' in place of a factory tuning. Another benefit of calculating estimated gains G' is that any per-device deviations from the factory defaults can be measured and accounted for.

While estimated gains G' can substitute for factory determined gains, a robust approach to determining the gain G for each band, that combines both factory gains and the online estimated gains G', is the following:

$$G=\max(\min(G',F+L),F-L)$$

where F is the factory gain for the band, G' is the estimated gain for the band, and L is a maximum allowed deviation from the factory settings. All gains are in dB. If a value G' exceeds the indicated range for a long period of time, this may indicate faulty hardware, and the noise compensation system may decide to fall back to safe behaviour.

A higher quality noise compensation experience can be maintained using a post-processing step performed (e.g., by element 39 of the FIG. 12 system) on the sequence of noise estimates generated (e.g., by element 37 of the FIG. 12 system) in accordance with an embodiment of the invention. For example, post-processing which forces a noise spectrum to conform to a particular shape in order to remove peaks may help prevent the compensation gains distorting the timbre of the playback content in an unpleasant way.

An aspect of some embodiments of the inventive noise estimation method and system is post-processing (e.g., performed by an implementation of element 39 of the FIG. 12 system), e.g., post-processing which implements an imputation strategy to update old noise estimates (for some frequency bands) which have gone stale due to lack of gaps in the playback content, although noise estimates for other bands have been updated sufficiently.

Stale value imputation may not be necessary in embodiments where a sufficient number of gaps (including forced gaps inserted by operation of forced gap applicator 70) are constantly available, and bands are rarely stale.

As noted, operation of forced gap applicator 70 may cause a sufficient number of gaps (including forced gaps) in content 25 to be present to allow implementation of a version of the FIG. 12 system which does not include an echo canceller. Removing an echo canceller from a noise compensation system desirably:

saves a large amount of development time, as echo cancellers demand a large amount of time and research to tune to ensure cancellation performance and stability;

saves computation time, as large adaptive filter banks (for implementing echo cancellation) typically consume large resources and often require high precision arithmetic to run; and removes the need for shared clock domain and time alignment between the microphone signal and the playback audio signal. Echo cancellation relies on both playback and recording signals to be synchronised on the same audio clock.

A noise estimator (implemented in accordance with any of typical embodiments of the invention, e.g., without echo cancellation) can run at an increased block rate/smaller FFT size for further complexity savings. Echo cancellation performed in the frequency domain typically requires a narrow frequency resolution.

When using echo cancellation to generate noise estimates in accordance with some embodiments of the invention (including by insertion of forced gaps into a playback signal), echo canceller performance can be reduced without compromising user experience (when the user listens to noise compensated playback content, implemented using noise estimates generated in accordance with such embodiments of the invention), since the echo canceller need only perform enough cancellation to reveal gaps (including forced gaps) in playback content, and need not maintain a high ERLE for the playback content peaks ("ERLE" here denotes echo return loss enhancement, a measure of how much echo, in dB, is removed by an echo canceller).

We next describe methods (which may be implemented in any of many different embodiments of the inventive pervasive listening method) for determining urgency values or a signal (U) indicative of urgency values.

An urgency value for a frequency band indicates the need for a gap to be forced in the band. We present three strategies for determining urgency values, $U_k$, where $U_k$ denotes urgency for forced gap insertion in band k, and U denotes a vector containing the urgency values for all bands of a set of $B_{count}$ frequency bands:

$$U=[U_0, U_1, U_2, \ldots].$$

The first strategy (sometimes referred to herein as Method 1) determines fixed urgency values. This method is the simplest, simply allowing the urgency vector U to be a predetermined, fixed quantity. When used with a fixed perceptual freedom metric, this can be used to implement a system that randomly inserts forced gaps over time. The system of FIG. 7 or FIG. 8 is sufficient to implement this method, as the method does not require time-dependent urgency values supplied by a pervasive listening application. Thus:

$$U=[u_0, u_1, u_2, \ldots, u_x]$$

where $X=B_{count}$, and each value $u_k$ (for k in the range from k=1 to $k=B_{count}$) is a predetermined, fixed urgency value for the "k" band. Setting all $u_k$ to 1.0 would express an equal degree of urgency in all frequency bands.

The second strategy (sometimes referred to herein as Method 2) determines urgency values which depend on elapsed time since occurrence of a previous gap. Typically, one can expect that urgency gradually increases over time, and returns low once either a forced or existing gap causes an update in a pervasive listening result (e.g., a background noise estimate update).

Thus, the urgency value $U_k$ in each frequency band (band k) may be the number of seconds since a gap was seen (by a pervasive listener) in band k. Thus:

$$U_k(t)=\min(t-t_g, U_{max})$$

where $t_g$ is the time at which the last gap was seen for band k, and $U_{max}$ is a tuning parameter which limits urgency to a maximum size. It should be noted that $t_g$ may update based on the presence of gaps originally present in the playback content. Urgency can be computed in this way either by a forced gap applicator (e.g., in the system of FIG. 7 or 8) or by a pervasive listening subsystem (e.g., in the system of FIG. 9, 10, 11, or 12). If the urgency is computed by the pervasive listening subsystem, the criteria for what is considered a gap may be more appropriate for that subsystem (than if the urgency is determined externally). For example, in noise compensation, the current noise conditions in the playback environment determine what is considered a gap in the output playback signal. That is, the playback signal must be quieter when the environment is quiet for a gap to occur, than in the case that the environment is noisier. Likewise, the urgency for frequency bands typically occupied by human speech will typically be of more importance when implementing a pervasive listening method which depends on occurrence or non-occurrence of speech utterances by a user in the playback environment.

The third strategy (sometimes referred to herein as Method 3) determines urgency values which are event based. In this context, "event based" denotes dependent on some event or activity (or need for information) external to the playback environment, or detected or inferred to have occurred in the playback environment. Urgency determined by a pervasive listening subsystem may vary suddenly with the onset of new user behavior or changes in playback environment conditions. For example, such a change may cause the pervasive listener to have an urgent need to observe background activity in order to make a decision, or to rapidly tailor the playback experience to new conditions, or to implement a change in the general urgency or desired density and time between gaps in each band. Table 2 below provides a number of examples of contexts and scenarios and corresponding event-based changes in urgency:

TABLE 2

| CONTEXT | Conditions | Change in Urgency | Examples |
|---|---|---|---|
| User Interface | Some played out audio or other modality has requested verbal or auditory response from the user, without pausing or ducking the played out audio | Increase | Incoming message tone waiting for user to "answer" the question "Is this the song you wanted?" by uttering a response |
| Environment Scanning | Occasional deeper probe of background noise and what may be going on in the playback environment | Increase | When the pervasive listener has not detected any user speech or button presses for a while, it may listen closely to see if the user is still present. |
| Request or Metadata Indicating Quality is a Priority | Something from the user, or data available to the pervasive listener, suggests that playback audio should not have forced gaps inserted therein | Decrease | "Alexa" signature voice user says "Play this bit loud and clear" |
| Predictive Behaviour | Points of content that either heuristically or from population data line up with the times that users want to talk or be heard. | Increase or Decrease | 5s into playback of a new track, expect a "skip" or "turn it up" utterance, or in response to occurrence of offensive language in content look for a parent uttering "stop" |

A fourth strategy (sometimes referred to herein as Method 4) determines urgency values using a combination of two or more of Methods 1, 2, and 3. For example, each of Methods 1, 2, and 3 may be combined into a joint strategy, represented by a generic formulation of the following type:

$$U_k(t) = U_k * \min(t - t_g, U_{max}) * V_k$$

where $u_k$ is a fixed unitless weighting factor that controls the relative importance of each frequency band, $V_k$ is a scalar value that is modulated in response to changes in context or user behaviour that require a rapid alteration of urgency, and $t_g$ and $U_{max}$ are defined above. Typically, the values $V_k$ are expected to remain at a value of 1.0 under normal operation.

We next describe methods (which may be implemented in any of many different embodiments of the inventive pervasive listening method) for determining perceptual freedom values (or a signal indicative thereof) for use by a forced gap applicator to insert forced gaps in a playback signal.

In this context, "F" is defined to be a "perceptual freedom" signal indicative of perceptual freedom values, $f_k$, where each of such perceptual freedom values has a relatively large magnitude when perceptual impact of forcing a gap in a corresponding band k at a point in time is low, and a relatively smaller magnitude (smaller than the relatively large magnitude) when perceptual impact of forcing a gap in the band k at the point in time is high. For example, perceptual freedom value $f_k$ may be the inverse of the perceptual distortion introduced by a forced gap in the "k"th band.

A first strategy determines fixed perceptual freedom values. For example, "F" may be a predetermined, fixed vector:

$$F = [f_0, f_1, f_2, \ldots, f_X]$$

where $X = B_{count}$ (the number of available bands in which a forced gap may be inserted) and value $f_k$ (for k in the range from k=1 to k=$B_{count}$) is a predetermined, fixed perceptual freedom value for the "k" band. Although a flat structure of $f_k = 1.0$ for all $f_k$ will treat all bands equally (in the sense that forced gaps will not be inserted preferentially in specific ones of the bands in response to the identical perceptual freedom values), it is true that different frequency bands will have intrinsic differences in perceptibility. In particular, gaps inserted in bands below 1 kHz and above 6 kHz will be more perceptually impactful than those between these frequencies. A fixed perceptual freedom vector that takes into consideration this phenomenon can be effective, in some implementations of forced gap insertion.

A second strategy determines perceptual freedom values using a perceptual masking curve. In this strategy, forced gaps inserted into a stream of playback content may be considered a kind of distortion. Choosing frequency bins (or bands) in which to place distortion from among a discrete set of frequency bins is a problem also encountered in the art of information hiding, and lossy audio codecs. Those skilled in the art of information hiding and lossy audio compression will be familiar with the concept of a perceptual masking curve. Such curves help indicate where distortions resulting from the addition of noise would be inaudible to a human listener.

There are many known methods for determining a perceptual masking curve which takes advantage of any number of psychoacoustic effects. For example, two such methods are frequency masking and temporal masking. Examples of such methods are described in Swanson, M. D., Kobayashi, Mei, and Tewfik, Ahmed (1998), Multimedia Data-Embedding and Watermarking Technologies, Proceedings of the IEEE, Vol. 86, Issue 6, pp. 1064-1087.

Figure 14:
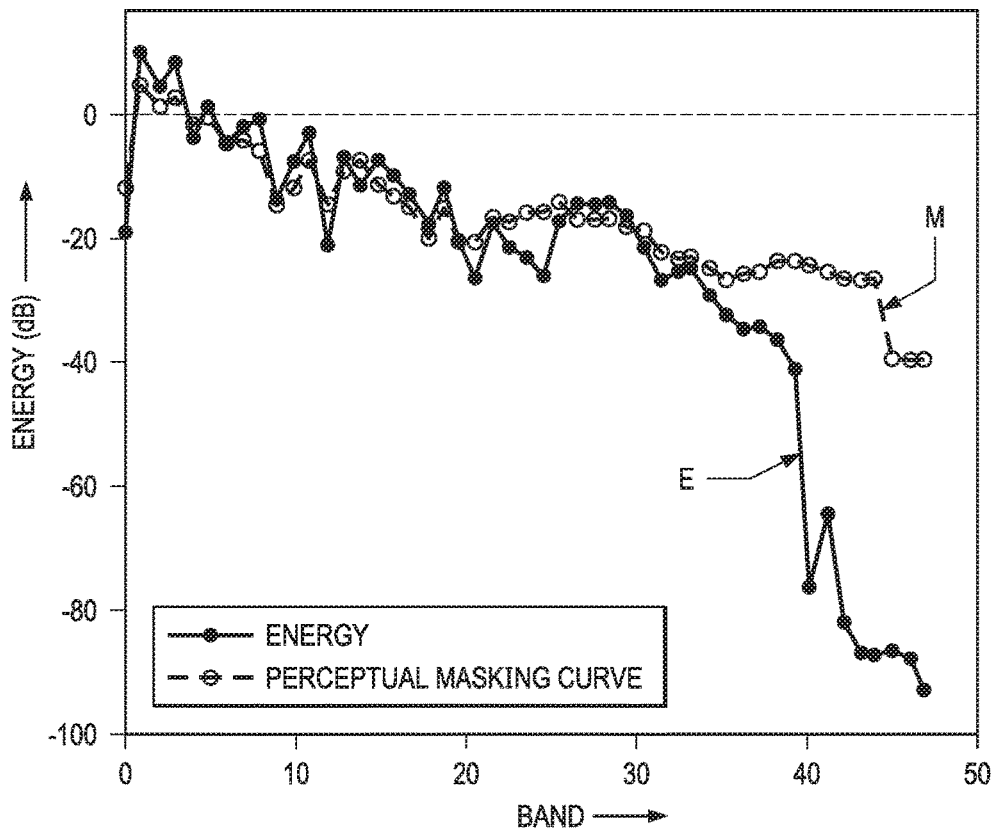
FIG. 14 is a graph of current banded energy (curve E) of playback content and a perceptual masking curve (curve M) for the playback content, each curve plotted as a function of energy in dB (indicated on the vertical axis) versus frequency band (indicated on the horizontal axis), for each of 49 exponentially spaced frequency bands (band 0 through band 48).

To compute $f_k$ values in accordance with the second strategy, we introduce a perceptual masking curve, M, which has discrete values across the $B_{count}$ bands. FIG. 14 is an example of current banded energy (curve E) of playback content and a perceptual masking curve (curve M) for the playback content, each curve plotted as a function of energy in dB (indicated on the vertical axis) versus frequency band (indicated on the horizontal axis), for each of 49 exponentially spaced frequency bands (band 0 through band 48). Modifications to the playback content in bands in which the energy E is lower than the masking curve M are less perceptually audible than in bands where the energy E is above the masking curve M. Hence, we take the distance between the values of the curves (for the "k"th band) to be the perceptual freedom $f_k$ for the "k"th band:

$$f_k = M_k - E_k.$$

Next, we describe an example embodiment for determining perceptual freedom values in accordance with a perceptual mask computation. In the example, the banded playback content energies ($E_k$) are:

$$E = [E_0, E_1, E_2, \ldots], \text{ and}$$

the aim is to produce masking threshold values ($M_k$) for the bands:

$$M = [M_0, M_1, M_2, \ldots]$$

such that the difference $M_k - E_k$ (for the "k"th band), which is the perceptual freedom value freedom $f_k$ for the "k"th band, is a value inversely proportional to the perceptibility of a forced gap in the "k"th band. The definition of a masking threshold here does not promise the imperceptibility of inserting a forced gap. It is well known how to use masking curves in scenarios where imperceptibility has been proven and demonstrated with controlled signals and conditions, however the computation of perceptual freedom only requires that the curves are indicative of this, not normative.

Loud signals have the ability to mask quieter signals nearby in frequency, a phenomena known as "frequency masking" (or "spectral masking" or "simultaneous masking"). In the example, the concept of frequency masking is applied to the banded energies E, to determine masking threshold values $M_k$ by spreading the energies in accordance with the following algorithm:

$$M_0 = E_0,$$

$$M_k = \max(E_{k-1} * s_{k-1}, E_k) \text{ for bands } k = 1, 2, \ldots, M_{count} - 1, \text{ and}$$

$$M_k = \max(M_{k+1} * s_{k+1}, M_k) \quad \text{for bands} \quad k = 0, 1, \ldots, B_{count} - 2,$$

where the lines are performed sequentially (updating the value "k" in $M_k$ during each performance), and where $s_k$ are spreading factors derived from a psychoacoustic model. The spreading factors are typically proportional the bandwidths of the corresponding frequency bands. For logarithmically spaced bands with increasing bandwidth, the following simple linear approximation is typically sufficient:

$$s'_k = \max\left(0.0, 1.0 - \frac{k}{0.8 * B_{count}}\right),$$

where $$s_k = 10^{-1.5 * s'_k}.$$

Playback of loud signals has the ability to mask playback of quieter signals which occurs soon thereafter, a phenomena known as "temporal masking." In the example, we model temporal masking by a decaying exponential applied to the banded energies. In the example, forward temporal masking is applied to determine masking thresholds $M_{k,t}$ for masking curves (each curve for a different value of time t), where $M_{k,t}$ is the masking threshold for frequency band k for the curve for time t, in accordance with the following algorithm, which applies the model with an exponential truncated to T previous values of each of the above-determined masking thresholds $M_k$:

$$M_{k,t} = \max(M_{k,t}, M_{k,t-1}*e^{-\alpha}, M_{k,t-2}*e_k^{-2\alpha}, \ldots) \text{ for each different band index } k,$$

where the maximum ("max( )") for each band, k, is taken over the T terms (the value $M_k$ for the time t, and the values $M_k$ for each of the T−1 previous times) for that band. The parameter α in the above expression is the decay rate of the exponential which will depend on the system's block rate/sampling rate. A value of α that achieves a decay rate of 0.1 dB/ms is a sensible default value of α.

The example method of determining masking thresholds optionally includes a step of emphasizing the masking curve. In this step, the masking curve is emphasized to lift the curve upwards for low-energy bands, which typically achieves good results when the emphasized curves are used for inserting gaps. This final step is optional, and is useful if the (non-emphasized) masking curves are too conservative for the application of forced gaps. A typical implementation of the emphasizing step replaces each previously determined value $M_k$ with the following emphasized value:

$$M_k = (\sqrt[4]{M_k} + 0.1)^4.$$

We next describe typical aspects of probabilistic forced gap insertion implemented in accordance with some embodiments of the invention.

Once urgency and perceptual freedom values have been calculated or otherwise determined, they are combined (in some embodiments of forced gap insertion) to form the (above-mentioned) discrete probability distribution P:

$$P'_k = \delta * U_k + (1-\delta) * F_k$$

$$P_k = \frac{P'_k}{\sum_i P'_i}$$

in which the parameter δ controls the relative importance of urgency ($U_k$) over perceptual freedom ($F_k$). Such a probability distribution is convenient to tune and control.

An example of an algorithm for selecting bands of a playback signal in which to insert forced gaps (using the probability distribution of the previous paragraph), in each frame of analysis, is as follows:

1. Compute or otherwise determine the values $U_k$, and $F_k$ for the current frame of analysis (optionally, limiting the values $U_k$ so that they do not exceed a value $U_{max}$);
2. Compute the values $P_k$ (of the distribution P) from which to select (draw) bands for forced gap insertion; and
3. If at least $T_p$ seconds have passed since gaps were last forced,
   a. Draw N bands randomly from the distribution P and,
   b. Discard any bands for which $U_k$ is below a threshold $U_{min}$, or for which $F_k$ is above a threshold $F_{min}$, and
   c. Initiate gap forcing in the bands remaining after steps 3a and 3b.

By randomly selecting from the distribution P, structured patterns of gaps are avoided, which would otherwise create perceptible artifacts of their own. Step 3b ultimately lowers the actual number of gaps created, but has the important advantage of being very easy to tune, and being highly connected to the perceptual cost of the system. Typical defaults for the values of the parameters in the example method, to optimize the general distribution shape for lower perceptible impact and timely response to urgency, are set forth in the following table

| Parameter | Default | Units | Purpose |
|---|---|---|---|
| Delta (δ) | 0.5 | Unitless [0, 1] | Scale and combine the quantities of urgency and perceptual freedom in the probability distribution P. |
| $U_{max}$ | 10.0 | Seconds | Limit the urgency quantity in magnitude. |
| $U_{min}$ | 4.0 | Seconds | The minimum period of time that must pass after a gap is seen in a band, before a gap may be inserted in that band. |
| $F_{min}$ | — | dB | Minimum level of perceptual freedom required to force a gap, should be tuned based on the specific perceptual masking curves used, and the degree to which impact on the audio can be tolerated in the system. |
| N | 1 | Unitless | The number of bands that are attempted to be forced at one time. |
| $T_p$ | 0.0 | Seconds | The amount of time that must elapse since the last gap was forced before the algorithm attempts to force new gaps. |

Figure 15:
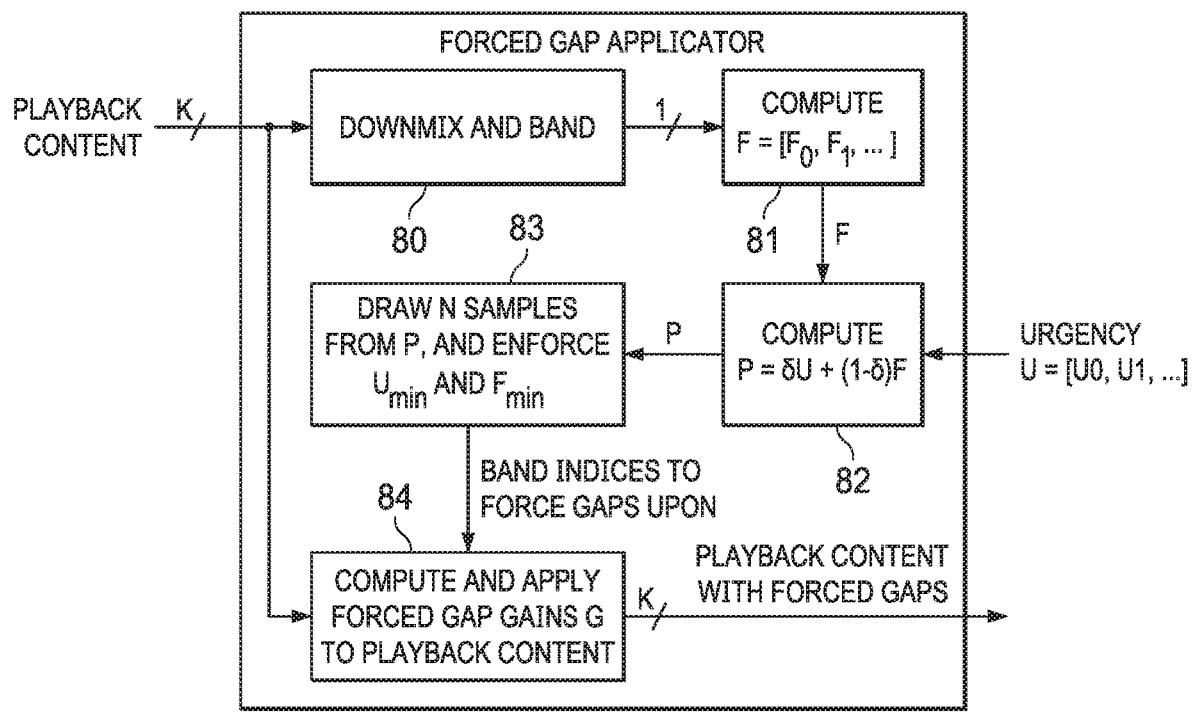
FIG. 15 is a block diagram of an embodiment of the inventive forced gap applicator.

Next, with reference to FIG. 15, we describe an embodiment of the inventive forced gap applicator (e.g., an embodiment of forced gap applicator 70 of FIG. 7, 8, 9, 10, 11, or 12). As shown in FIG. 15, which is a block diagram of such embodiment of the forced gap applicator, the input to the forced gap applicator is K channels of an audio playback signal (e.g., K channels which have been output from pervasive listener subsystem 72 of FIG. 8, when the FIG. 15 system implements forced gap applicator 70 of FIG. 8). The FIG. 15 system includes downmixing and banding subsystem 80 which is configured to downmix the K input channels to a mono feed and to band the mono feed, thereby determining a playback energy value for each time interval of each of a set of $B_{count}$ frequency bands of the mono feed. The output of subsystem 80 is provided to perceptual masking subsystem 81 which is configured to compute perceptual freedom signal, F, which is indicative of a perceptual freedom value $F_k$ for each of the $B_{count}$ frequency bands for each time interval. Subsystem 81 may be configured to determine the perceptual freedom values, $F_k$, so that they are any of the examples of perceptual freedom values described herein.

The output of subsystem 81 is provided to probability distribution subsystem 82, which is configured to determine a probability distribution, P (e.g., a fixed, time-invariant distribution, or a distribution which is updated at times corresponding to different time intervals of the mono feed). In accordance with the probability distribution, a set of N of the frequency bands (e.g., a set of N of the bands for each time interval of the mono feed) can be drawn randomly by subsystem 83, so that subsystem 84 can insert forced gaps in each set of drawn bands. Subsystem 82 is typically configured to generate (and optionally to update, for each of a number of different time intervals of the mono feed) the probability distribution P to be a distribution of the following form (which is described above in this disclosure):

$$P_k = \frac{P'_k}{\sum_l P'_l}$$

where $$P'_k = \delta * U_k + (1-\delta) * F_k,$$

and where $F_k$ are perceptual freedom values determined by subsystem 81 (e.g., for the relevant time interval), $U_k$ are values indicative of urgency for each band (i.e., $U_k$ is the urgency value for the "k"th band), P'k is the (non-normalized) probability of selection of the "k"th band, δ is a parameter indicative of relative importance of urgency and perceptual freedom considerations, and the summation is over all the frequency bands (so that $P_k$ is the normalized version of P'k for the "k"th band).

In some implementations, a banded urgency signal U, indicative of the urgency values, $U_k$, (e.g., for a time interval of the playback signal) is provided to subsystem 82 from an external source (e.g., pervasive listener subsystem 73 of FIG. 9 or noise estimation subsystem 64 of FIG. 11). The external source is typically a pervasive listener (e.g., a smart voice assistant, noise estimator, or background activity classifier). Alternatively, subsystem 82 is configured to determine the urgency values, $U_k$, (e.g., for a time interval of the playback signal), e.g., so that they are any of the examples of urgency values described herein. Subsystem 82 is configured to combine the urgency values, $U_k$, and the perceptual freedom values, $F_k$, to determine (and in some cases, to update) the probability distribution P.

Subsystem 83 is coupled and configured to select (draw) a set of N bands randomly (once for each time interval of the mono feed) from the probability distribution P determined by subsystem 82 (for the corresponding time interval), and typically also to check that the bands of each set of drawn bands satisfy minimum requirements $F_{min}$ and $U_{min}$ (of the type described above). If the urgency value, $U_k$, or the perceptual freedom value, $F_k$, corresponding to a drawn band does not satisfy the relevant one of the minimum requirements, $F_{min}$ and $U_{min}$, the band is typically discarded (no forced gap is inserted therein).

Subsystem 83 is configured to notify gap application subsystem 84 of each set of bands (one set for each time interval of the mono feed determined by subsystem 80) into which forced gaps are to be inserted. In response to each such notification, subsystem 84 is configured to insert a forced gap (during the appropriate time interval) in each of the bands which have been notified thereto. The insertion of each forced gap includes computation of the forced gap gains G to be applied, and application of these gains to the K channels of playback content in the appropriate frequency band and time interval (of each channel), thereby inserting a forced gap in each such channel in which non-playback sound may be monitored (by a pervasive listener) during playback.

We next describe typical forced gap application system behavior, assuming different choices of methods for determining urgency values (i.e., above-described Methods 1, 2, 3, and 4) and different choices of methods for determining perceptual freedom values (i.e., the above-described method for determining fixed perceptual freedom values, and the above-described method for determining perceptual freedom values using at least one masking curve). Table 3 (set forth below) compares the typical behavior of a forced gap application system, for the indicated choices of methods of determining urgency and perceptual freedom values.

TABLE 3

| | Urgency Fixed (Method 1) | Urgency Grows in Time (Methods 2-4) |
|---|---|---|
| Fixed perceptual freedom values | Random forced gaps. | Forced gaps are inserted with purpose as they are needed. |
| Perceptual Freedom Masking Curve | Opportunistic (e.g., in bands benefiting from frequency masking and/or at times benefiting from temporal masking). It may not be known if an inserted forced gap is needed. Forced gap insertion may be performed in accordance with balancing of a random forced gap density against opportunity for low perceptual cost insertions (e.g., to insert a gap that is not needed but which has low perceptual cost) | Balanced. Forced gap insertion is performed so as to implement a balance of need against perceptual cost. Potentially allows best pervasive listening performance, but possibly at a cost of high tuning complexity. |

The following table describes aspects of different embodiments of forced gap insertion, which may rely on different types of masking to insert forced gaps at low perceptual cost. These aspects include factors useful in some embodiments to shape and create perceptual masking curves for computation of perceptual freedom.

| Gap Masking Factor | Characteristics | Notes |
|---|---|---|
| Spectral Masking (i.e., Frequency Masking) | Gaps inserted in the spectral 'shadow' of (i.e., in bands near to) a peak energy band (a band having a playback content energy peak) at a particular (peak energy) frequency, are less likely to be audible than are gaps inserted in bands farther from the peak energy band. This masking can be at least somewhat symmetric in the sense that forced gaps are less likely to be audible both at frequencies just above and just below the frequency of a peak energy band. | |

| Gap Masking Factor | Characteristics | Notes |
|---|---|---|
| Temporal Masking | At a time when a particularly loud event has just happened, a human listener is likely to be immune to broadband changes (e.g., insertion of forced gaps in a wide range of frequency bands) for a short period of time afterward. This masking is very asymmetric (in that it does not apply at times before occurrence of the loud event. | Forced gaps can desirably be inserted (i.e., at low perceptual cost) at times within a short time interval just after a sudden loud event indicated by playback content. |
| Rhythm Masking | If a forced gap is inserted, it may be repeated (with low perceptual cost) in accordance with temporal cadence (beat) or time texture of the playback sound. | |
| Textural Masking | If playback sound has a grainy texture over time and frequency, forced gaps may be inserted at times and frequencies corresponding to or in contrast with the playback sound texture to reduce perceptibility of the inserted gaps. | There would typically need to be some textural gaps indicated by the playback sound, so that forced gaps could be inserted in a similar statistical pattern to that of the existing textural gaps. |

Aspects of some embodiments of the present invention include the following:

methods and system for insertion of forced sampling gaps into playback content for the purpose of improved performance of pervasive listening methods (using local microphones to capture both the playback sound and non-playback sound), without a significant perceptual impact to the user;

methods and system for insertion of forced sampling gaps into playback content based on urgency or need to do so;

methods and system for insertion of forced sampling gaps into playback content based on relative perceptual impact through using a masking curve;

methods and system for insertion of forced sampling gaps into playback content based on balancing of relative perceptual impact of gap insertion and urgency for gap insertion;

methods and system for insertion of forced sampling gaps into playback content for the purpose of improved performance of pervasive listening methods (in contrast with barge-in ducking or pausing of the playback audio), whereby defining parameters of a forced sampling gap are determined proportionally to the duration of time that components of a noise estimate have not updated, and/or whereby defining parameters of a forced sampling gap are determined through an optimization process that minimizes perceptual impact of the forced gaps by considering their proximity in time and space to the playback audio signal;

methods and systems that extend noise compensation functionality through the use of forced sampling gaps, whereby the trigger to force the presence of gaps in the playback content is automatically linked to the duration of time elapsed since components of a noise estimate have updated, and/or whereby the trigger to force the presence of gaps in the playback content is requested by a secondary device or by user demand;

methods and systems that extend noise compensation functionality and/or background sound awareness including by forced gap insertion, using a perceptual model for the impact of forced gap insertion, e.g., balanced against accumulated need or desire for insertion of a forced gap.

We next describe examples of operation of embodiments of the inventive system (e.g., the system of FIG. 11 or 12) which implement noise compensation. When a noise estimate determined by the system (e.g., by subsystem 64 of FIG. 11) sticks due to a lack of sampling gaps in the playback content, three scenarios can then unfold:

1. Noise conditions increase, while the estimate is stuck;
2. Noise conditions decrease, while the estimate is stuck; or
3. Noise conditions persist, while the estimate is stuck.

In Case 3 (when noise conditions persist), the system will continue to perform compensation in the previously determined manner, but because the system cannot distinguish this case from the other cases, we consider the impact of forcing gaps during Case 3.

Table 4 set forth below sets forth assessments of the three scenarios where forced gaps are introduced to combat stale noise estimates brought on by a lack of sampling gaps available in the playback content.

TABLE 4

| Severity of failure to update noise compensation | Frequency | Duration of Gap Forcing Process | Forced Gap Perceptibility | Urgency of forced gap insertion |
|---|---|---|---|---|
| Case 1: Noise conditions increase | Impaired intelligibility, timbre | Moderately often, based on environment | Brief when enough forced gaps are provided to update the noise estimate. | Low, masked by noise conditions. | Medium |
| Case 2: Noise conditions decrease | Playback annoyingly loud, unnecessarily impacted voice assistant performance | Moderately often, based on environment | Very brief, system unwinds rapidly through positive feedback after gaps introduced | High, no noise conditions for masking. | Very high |
| Case 3: Noise conditions persist | Suitable compensation amount | Highly frequent, the steady state for dense content | Long, throughout the time the system has converged. | High, as the system SNR is maintained by noise compensation as desired. | High |

Cases 1 and 2 are expected to be short-lived events, lasting only as long as it takes for the system to re-converge (using inserted forced gaps) to an accurate noise estimate. Case 1 should reconverge quickly, as even small gaps will help the system find the increased noise conditions. Case 2 should also reconverge quickly, due to the positive feedback in compensation systems that favour lower noise estimates for stability. Case 3 will be the steady state of the system, for as long as the content is dense and poor in gaps. Hence the impact of forced gaps on audio quality should be considered predominantly for Case 3.

Table 4 shows a trend between urgency and the potential perceptibility of forced gaps. Higher urgency generally implies that the system is struggling to hear the background conditions, so the signal to noise ratio (SNR) of the playback content is high. A higher SNR of playback content to background noise will provide less masking, increasing the chances of forced gaps to be more perceptible.

Exemplary embodiments of the inventive method include the following:

E1. A pervasive listening method, including steps of:

inserting at least one gap into at least one selected frequency band of an audio playback signal to generate a modified playback signal;

during emission of sound in a playback environment in response to the modified playback signal, using a microphone in the playback environment to generate a microphone output signal, wherein the sound is indicative of playback content of the modified playback signal, and the microphone output signal is indicative of non-playback sound in the playback environment and the playback content; and monitoring the non-playback sound in the playback environment in response to the modified playback signal and the microphone output signal.

E2. The method of E1, wherein each said gap is inserted into a selected frequency band, in a selected time interval, of the audio playback signal, in an effort so that any artifact, in the sound emitted in the playback environment in response to the modified playback signal, resulting from insertion of the gap has low perceptibility to a user in the playback environment, and high identifiability during performance of the monitoring.

E3. The method of E1, wherein each said gap is inserted into a selected frequency band, in a selected time interval, of the audio playback signal such that the sound emitted in the playback environment in response to the modified playback signal is perceivable by the user without any significant artifact resulting from insertion of the gap.

E4. The method of E1, wherein each said gap is inserted into a selected frequency band of the audio playback signal, and each said selected frequency band is determined by selection, from a set of frequency bands of the audio playback signal, implemented using perceptual freedom values indicative of expected perceptual effect of insertion of a gap in each band of the set of frequency bands.

E5. The method of E4, wherein the perceptual freedom values are determined in accordance with at least one frequency masking consideration, such that when one of the perceptual freedom values is a near peak value for a near peak band which is near to a peak energy band of the set of frequency bands, each of the perceptual freedom values, for a band farther from the peak energy band than is said near peak band, is indicative of greater expected perceptual effect than is said near peak value.

E6. The method of E4, wherein the perceptual freedom values are determined in accordance with at least one temporal masking consideration, such that when the audio playback signal is indicative of at least one loud playback sound event, those of the perceptual freedom values for a first time interval of the audio playback signal occurring shortly after the loud playback sound event, are indicative of lower expected perceptual effect than are those of the perceptual freedom values for a second time interval of the audio playback signal, where the second time interval is later than the first time interval.

E7. The method of E1, wherein the pervasive listening method is a noise estimation method, the microphone output signal is indicative of background noise in the playback environment, and the monitoring includes generating an estimate of background noise in the playback environment in response to the modified playback signal and the microphone output signal.

E8. The method of E1, wherein the monitoring includes generation of an estimate of at least one aspect of the non-playback sound in the playback environment in response to the modified playback signal and the microphone output signal, and wherein the method also includes a step of:

generating the audio playback signal in response to the estimate of at least one aspect of the non-playback sound in the playback environment.

E9. The method of E1, wherein each said gap is inserted into the playback signal based on need for a gap in at least one frequency band of the playback signal.

E10. The method of E9, wherein each said gap is inserted into the playback signal in response to urgency values indicative of urgency for gap insertion in each band of a set of frequency bands of the playback signal.

E11. The method of E9, wherein each said gap is inserted into the playback signal in response to urgency values indicative of urgency for gap insertion in each band of a set of frequency bands of the playback signal, and based on expected perceptual effect of insertion of a gap in said each band of the set of frequency bands of the playback signal.

E12. The method of E9, wherein each said gap is inserted into the playback signal in a manner including balancing of urgency and expected perceptual effect of gap insertion, using urgency values indicative of urgency for gap insertion in each band of a set of frequency bands of the playback signal, and based on expected perceptual effect of insertion, in at least one specific time interval of the playback signal, of a gap in said each band of the set of frequency bands of the playback signal.

E13. The method of E1, including steps of:

determining a probability distribution indicative of a probability for each band of a set of frequency bands of the playback signal; and in accordance with the probability distribution, randomly selecting at least one of the frequency bands of the set, and inserting a gap in each of said at least one of the frequency bands.

E14. The method of E13, wherein the probability distribution is based on need for a gap in each said band of the set of frequency bands of the playback signal.

E15. The method of E13, wherein the probability distribution is based on need for a gap, and expected perceptual effect of insertion of the gap, in each said band of the set of frequency bands of the playback signal.

E16. The method of E1, including a step of:

generating urgency values in response to the microphone output signal and the modified playback signal, wherein the urgency values are indicative of need for a gap, in each band of a set of frequency bands of the playback signal, based on elapsed time since occurrence of a previous gap in said each band, and wherein insertion of each gap into the playback signal is at least partially based on the urgency values.

E17. The method of E1, wherein the monitoring of the non-playback sound includes generation of background noise estimates, wherein the method also includes a step of:

generating the audio playback signal in response to the background estimates, including by performing noise compensation on an input audio signal in response to the background estimates.

E18. A system, including:

a microphone, positioned and configured to generate a microphone output signal during emission of sound in a playback environment, wherein the sound is indicative of playback content of a modified playback signal, and the microphone output signal is indicative of non-playback sound in the playback environment and the playback content;

a forced gap application subsystem, coupled to receive an audio playback signal, and configured to insert at least one gap into at least one selected frequency band of the audio playback signal, thereby generating the modified playback signal; and a pervasive listening subsystem, coupled to receive the microphone output signal and the modified playback signal, and configured to monitor the non-playback sound in the playback environment in response to the modified playback signal and the microphone output signal.

E19. The system of E18, wherein the forced gap application subsystem is configured to insert each said gap into a selected frequency band, in a selected time interval, of the audio playback signal, in an effort so that any artifact, in the sound emitted in the playback environment in response to the modified playback signal, resulting from insertion of the gap has low perceptibility to a user in the playback environment, and high identifiability during performance of the monitoring.

E20. The system of E18, wherein the forced gap application subsystem is configured to insert each said gap into a selected frequency band of the audio playback signal, including by selecting each said selected frequency band, from a set of frequency bands of the audio playback signal, using perceptual freedom values indicative of expected perceptual effect of insertion of a gap in each band of the set of frequency bands.

E21. The system of E20, wherein the perceptual freedom values have been determined in accordance with at least one frequency masking consideration.

E22. The system of E20, wherein the perceptual freedom values have been determined in accordance with at least one temporal masking consideration.

E23. The system of E18, wherein the microphone output signal is indicative of background noise in the playback environment, and the pervasive listening subsystem is configured to generate an estimate of the background noise in the playback environment in response to the modified playback signal and the microphone output signal.

E24. The system of E18, wherein the pervasive listening subsystem is coupled and configured:

to generate an estimate of at least one aspect of the non-playback sound in the playback environment in response to the modified playback signal and the microphone output signal; and to generate the audio playback signal in response to the estimate of at least one aspect of the non-playback sound in the playback environment.

E25. The system of E18, wherein the forced gap application subsystem is configured to insert each said gap into the playback signal based on need for a gap in at least one frequency band of the playback signal.

E26. The system of E25, wherein the forced gap application subsystem is configured to insert each said gap into the playback signal in response to urgency values indicative of urgency for gap insertion in each band of a set of frequency bands of the playback signal.

E27. The system of E25, wherein the forced gap application subsystem is configured to insert each said gap into the playback signal in response to urgency values indicative of urgency for gap insertion in each band of a set of frequency bands of the playback signal, and based on expected perceptual effect of insertion of a gap in said each band of the set of frequency bands of the playback signal.

E28. The system of E25, wherein the forced gap application subsystem is configured to insert each said gap into the playback signal in a manner including balancing of urgency and expected perceptual effect of gap insertion, using urgency values indicative of urgency for gap insertion in each band of a set of frequency bands of the playback signal, and based on expected perceptual effect of insertion, in at least one specific time interval of the playback signal, of a gap in said each band of the set of frequency bands of the playback signal.

E29. The system of E18, wherein the forced gap application subsystem is configured to:

determine a probability distribution indicative of a probability for each band of a set of frequency bands of the playback signal; and in accordance with the probability distribution, to randomly select at least one of the frequency bands of the set, and to insert a gap in each of said at least one of the frequency bands.

E30. The system of E29, wherein the probability distribution is based on need for a gap in each said band of the set of frequency bands of the playback signal.

E31. The system of E29, wherein the probability distribution is based on need for a gap, and expected perceptual effect of insertion of the gap, in each said band of the set of frequency bands of the playback signal.

E32. The system of E18, wherein the pervasive listening subsystem is configured to:

generate urgency values in response to the microphone output signal and the modified playback signal, wherein the urgency values are indicative of need for a gap, in each band of a set of frequency bands of the playback signal, based on elapsed time since occurrence of a previous gap in said each band, and wherein the forced gap application subsystem is coupled to receive the urgency values and configured to insert each said gap into the playback signal in a manner at least partially based on the urgency values.

E33. The system of E18, wherein the pervasive listening subsystem is coupled and configured to:

monitor the non-playback sound including by generating background noise estimates, and generate the audio playback signal in response to the background estimates, including by performing noise compensation on an input audio signal in response to the background estimates.

Aspects of the invention include a system or device configured (e.g., programmed) to perform any embodiment of the inventive method, and a tangible computer readable medium (e.g., a disc) which stores code for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and a processing subsystem that is programmed (and/or otherwise configured) to perform an embodiment of the inventive method (or steps thereof) in response to data asserted thereto.

Some embodiments of the inventive system (e.g., some implementations of the FIG. 15 system, or elements 62, 70, 26, 27, 34, 32, 33, 35, 36, 37, 39, and 43 of the FIG. 12 system, or elements 70 and 71 of the FIG. 7 system, or elements 70 and 72 of the FIG. 8 system, or elements 70 and 73 of the FIG. 9 system, or elements 70, 74, and 76 of the FIG. 10 system, or elements 62, 70 and 64 of the FIG. 11 system) are implemented as a configurable (e.g., programmable) digital signal processor (DSP) that is configured (e.g., programmed and otherwise configured) to perform required processing on audio signal(s), including performance of an embodiment of the inventive method. Alternatively, embodiments of the inventive system (e.g., some implementations of the FIG. 15 system, or elements 62, 70, 26, 27, 34, 32, 33, 35, 36, 37, 39, and 43 of the FIG. 12 system, or elements 70 and 71 of the FIG. 7 system, or elements 70 and 72 of the FIG. 8 system, or elements 70 and 73 of the FIG. 9 system, or elements 70, 74, and 76 of the FIG. 10 system, or elements 62, 70 and 64 of the FIG. 11 system) are implemented as a general purpose processor (e.g., a personal computer (PC) or other computer system or microprocessor, which may include an input device and a memory) which is programmed with software or firmware and/or otherwise configured to perform any of a variety of operations including an embodiment of the inventive method. Alternatively, elements of some embodiments of the inventive system are implemented as a general purpose processor or DSP configured (e.g., programmed) to perform an embodiment of the inventive method, and the system also includes other elements (e.g., one or more loudspeakers and/or one or more microphones). A general purpose processor configured to perform an embodiment of the inventive method would typically be coupled to an input device (e.g., a mouse and/or a keyboard), a memory, and a display device.

Another aspect of the invention is a computer readable medium (for example, a disc or other tangible storage medium) which stores code for performing (e.g., coder executable to perform) any embodiment of the inventive method or steps thereof.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

The invention claimed is:

1. A pervasive listening method, comprising:
   inserting at least one gap into at least one selected frequency band, in a selected time interval, of an audio playback signal to generate a modified playback signal;
   during emission of sound in a playback environment in response to the modified playback signal, generating, using a microphone in the playback environment, a microphone output signal, wherein the sound is indicative of playback content of the modified playback signal, and the microphone output signal is indicative of non-playback sound in the playback environment and the playback content; and
   monitoring the non-playback sound in the playback environment in response to the modified playback signal and the microphone output signal.

2. The method of claim 1, wherein each said gap is inserted into a selected frequency band, in the selected time interval, of the audio playback signal, in an effort so that any artifact, in the sound emitted in the playback environment in response to the modified playback signal, resulting from insertion of the gap has low perceptibility to a user in the playback environment, and high identifiability during performance of the monitoring.

3. The method of claim 1, wherein each said gap is inserted into a selected frequency band, in a selected time interval, of the audio playback signal such that the sound emitted in the playback environment in response to the modified playback signal is perceivable by the user without any significant artifact resulting from insertion of the gap.

4. The method of claim 1, wherein each said gap is inserted into a selected frequency band of the audio playback signal, and each said selected frequency band is determined by selection, from a set of frequency bands of the audio playback signal, implemented using perceptual freedom values indicative of expected perceptual effect of insertion of a gap in each band of the set of frequency bands.

5. The method of claim 4, wherein the perceptual freedom values are determined in accordance with at least one frequency masking consideration, such that when one of the perceptual freedom values is a near peak value for a near peak band which is near to a peak energy band of the set of frequency bands, each of the perceptual freedom values, for a band farther from the peak energy band than is said near peak band, is indicative of greater expected perceptual effect than is said near peak value.

6. The method of claim 4, wherein the perceptual freedom values are determined in accordance with at least one temporal masking consideration, such that when the audio playback signal is indicative of at least one loud playback sound event, those of the perceptual freedom values for a first time interval of the audio playback signal occurring shortly after the loud playback sound event, are indicative of lower expected perceptual effect than are those of the perceptual freedom values for a second time interval of the audio playback signal, where the second time interval is later than the first time interval.

7. The method of claim 1, wherein the pervasive listening method is a noise estimation method, the microphone output signal is indicative of background noise in the playback environment, and the monitoring includes generating an estimate of background noise in the playback environment in response to the modified playback signal and the microphone output signal.

8. The method of claim 1, wherein the monitoring includes generation of an estimate of at least one aspect of the non-playback sound in the playback environment in response to the modified playback signal and the microphone output signal, and wherein the method further comprises:
   generating the audio playback signal in response to the estimate of at least one aspect of the non-playback sound in the playback environment.

9. The method of claim 1, wherein each said gap is inserted into the playback signal based on need for a gap in at least one frequency band of the playback signal.

10. The method of claim 9, wherein each said gap is inserted into the playback signal in response to urgency values indicative of urgency for gap insertion in each band of a set of frequency bands of the playback signal.

11. The method of claim 9, wherein each said gap is inserted into the playback signal in response to urgency values indicative of urgency for gap insertion in each band of a set of frequency bands of the playback signal, and based on expected perceptual effect of insertion of a gap in said each band of the set of frequency bands of the playback signal.

12. The method of claim 9, wherein each said gap is inserted into the playback signal in a manner including balancing of urgency and expected perceptual effect of gap insertion, using urgency values indicative of urgency for gap insertion in each band of a set of frequency bands of the playback signal, and based on expected perceptual effect of insertion, in at least one specific time interval of the playback signal, of a gap in said each band of the set of frequency bands of the playback signal.

13. The method of claim 1, comprising:
determining a probability distribution indicative of a probability for each band of a set of frequency bands of the playback signal; and
in accordance with the probability distribution, randomly selecting at least one of the frequency bands of the set, and inserting a gap in each of said at least one of the frequency bands.

14. The method of claim 13, wherein the probability distribution is based on need for a gap in each said band of the set of frequency bands of the playback signal.

15. The method of claim 13, wherein the probability distribution is based on need for a gap, and expected perceptual effect of insertion of the gap, in each said band of the set of frequency bands of the playback signal.

16. The method of claim 1, comprising:
generating urgency values in response to the microphone output signal and the modified playback signal, wherein the urgency values are indicative of need for a gap, in each band of a set of frequency bands of the playback signal, based on elapsed time since occurrence of a previous gap in said each band, and wherein insertion of each gap into the playback signal is at least partially based on the urgency values.

17. The method of claim 1, wherein the monitoring of the non-playback sound includes generation of background noise estimates, wherein the method further comprises:
generating the audio playback signal in response to the background estimates, including by performing noise compensation on an input audio signal in response to the background estimates.

18. A system, including:
a microphone, positioned and configured to generate a microphone output signal during emission of sound in a playback environment, wherein the sound is indicative of playback content of a modified playback signal, and the microphone output signal is indicative of non-playback sound in the playback environment and the playback content;
a forced gap application subsystem, coupled to receive an audio playback signal, and configured to insert at least one gap into at least one selected frequency band, in a selected time interval, of the audio playback signal, thereby generating the modified playback signal; and
a pervasive listening subsystem, coupled to receive the microphone output signal and the modified playback signal, and configured to monitor the non-playback sound in the playback environment in response to the modified playback signal and the microphone output signal.

19. The system of claim 18, wherein the forced gap application subsystem is configured to insert each said gap into a selected frequency band, in the selected time interval, of the audio playback signal, in an effort so that any artifact, in the sound emitted in the playback environment in response to the modified playback signal, resulting from insertion of the gap has low perceptibility to a user in the playback environment, and high identifiability during performance of the monitoring.

20. The system of claim 18, wherein the forced gap application subsystem is configured to insert each said gap into a selected frequency band of the audio playback signal, including by selecting each said selected frequency band, from a set of frequency bands of the audio playback signal, using perceptual freedom values indicative of expected perceptual effect of insertion of a gap in each band of the set of frequency bands.

* * * * *